(12) United States Patent
Groiss et al.

(10) Patent No.: US 10,924,102 B2
(45) Date of Patent: Feb. 16, 2021

(54) METHOD FOR DRIVING A TRANSISTOR DEVICE AND ELECTRONIC CIRCUIT

(71) Applicant: Infineon Technologies Austria AG, Villach (AT)

(72) Inventors: Stefan H. Groiss, Villach-Landskron (AT); Aliaksandr Subotski, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/460,153

(22) Filed: Jul. 2, 2019

(65) Prior Publication Data

US 2020/0028506 A1 Jan. 23, 2020

(30) Foreign Application Priority Data

Jul. 20, 2018 (EP) .................................... 18184654

(51) Int. Cl.
 *H03K 17/0812* (2006.01)
(52) U.S. Cl.
 CPC .............................. *H03K 17/08122* (2013.01)
(58) Field of Classification Search
 None
 See application file for complete search history.

(56) References Cited

U.S. PATENT DOCUMENTS

| 7,786,778 B1* | 8/2010 | Mannoorittathu ... H03K 5/1515 326/82 |
|---|---|---|
| 2009/0066402 A1 | 3/2009 | Hiyama |
| 2013/0107584 A1 | 5/2013 | Li et al. |

(Continued)

FOREIGN PATENT DOCUMENTS

EP  2 632 048 A1  8/2013

OTHER PUBLICATIONS

EP Search Report, Application No. Ep 18 18 4654, dated Jan. 7, 2019, pp. 7.

*Primary Examiner* — Cassandra F Cox
(74) *Attorney, Agent, or Firm* — Armis IP Law, LLC

(57) ABSTRACT

Disclosed is a method for driving a transistor device and an electronic circuit. The method includes: in an on-state of the transistor device (1), reducing a drive voltage ($V_{GS}$) of the transistor device (1) from a maximum voltage level ($V_{MAX}$) to an intermediate voltage level ($V_{INT}$) that is higher than a threshold voltage level ($V_{TH}$) of the transistor device (1); maintaining the intermediate voltage level ($V_{INT}$) for a predefined time period ($T_{INT}$); and reducing the drive voltage ($V_{GS}$) to below the threshold voltage level ($V_{TH}$) after the predefined time period ($T_{INT}$) to switch the transistor device to an off-state.

28 Claims, 17 Drawing Sheets

(56) References Cited

U.S. PATENT DOCUMENTS

| | | | |
|---|---|---|---|
| 2015/0008973 A1* | 1/2015 | Fukuta | H03K 17/168 |
| | | | 327/379 |
| 2016/0182034 A1* | 6/2016 | Wagoner | H03K 17/163 |
| | | | 327/432 |
| 2019/0267982 A1* | 8/2019 | Charpentier | H03K 3/012 |

* cited by examiner

METHOD FOR DRIVING A TRANSISTOR DEVICE AND ELECTRONIC CIRCUIT This application is related to and claims priority to earlier filed European patent application serial number EP18184654 entitled "METHOD FOR DRIVING A TRANSISTOR DEVICE AND ELECTRONIC CIRCUIT," (German attorney docket no. IFV559EP or 2018P50261EP), filed on Jul. 20, 2018, the entire teachings of which are incorporated herein by this reference.

This disclosure in general relates to a method for driving a transistor device and an electronic circuit having a drive circuit configured to drive a transistor device.

BACKGROUND

Transistor devices, such as MOSFETs (Metal Oxide Field-Effect Transistors) are widely used as electronic switches in various types of applications such as, for example, automotive, industrial, household or consumer electronic applications. Inevitably, an electronic circuit that includes a transistor device as an electronic switch further includes parasitic inductances in series to a load path of the transistor device. Such parasitic inductances may result from connection lines that connect the transistor device to other devices in the electronic circuit. When the transistor device switches from an on-state, in which it conducts a current, to an off-state, in which it blocks, the parasitic inductances may cause voltage spikes of a load path voltage of the transistor device.

BRIEF DESCRIPTION OF EMBODIMENTS

It is desirable to reduce such voltage spikes.

One example relates to a method. The method includes, in an on-state of a transistor device, reducing a drive voltage (such as a gate drive voltage) of the transistor device from a maximum voltage level to an intermediate voltage level that is higher than a threshold voltage level of the transistor device, and maintaining the intermediate voltage level for a predefined time period. The method further includes reducing the drive voltage to below the threshold voltage level after expiration of the predefined time period to switch the transistor device to an off-state.

Another example relates to an electronic circuit with a drive circuit. The drive circuit is configured, in an on-state of a transistor device, to reduce a drive voltage of the transistor device from a maximum voltage level to an intermediate voltage level that is higher than a threshold voltage level ($V_{TH}$) of the transistor device, to maintain the intermediate voltage for a predefined time period, and to reduce the drive voltage to below the threshold voltage after the predefined time period to switch the transistor device to an off-state.

Examples are explained below with reference to the drawings. The drawings serve to illustrate certain principles, so that only aspects necessary for understanding these principles are illustrated. The drawings are not to scale. In the drawings the same reference characters denote like features.

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
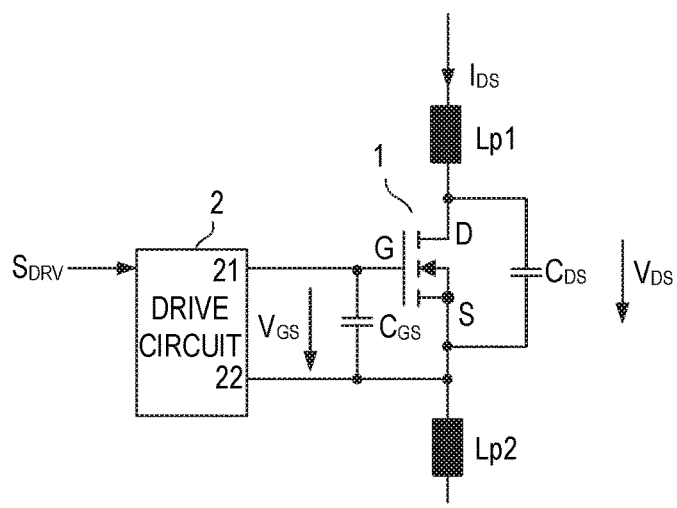
FIG. 1 shows one example of an electronic circuit including a transistor device and a drive circuit configured to drive the transistor device.

FIG. 1 shows one example of an electronic circuit that includes a transistor device 1 and a drive circuit 2. The transistor device 1 is configured to switch on or switch off dependent on a drive voltage $V_{GS}$ received at a drive input, and the drive circuit 2 is configured to generate the drive voltage $V_{GS}$ based on a drive signal $S_{DRV}$ received by the drive circuit 2. In the example shown in FIG. 1, the drive input of the transistor device 1 is formed by a control node G and a first load node S of the transistor device. The transistor device 1 further includes a second load node D, wherein the first load node S and the second load node D form a load path D-S of the transistor device 1.

According to one example, the transistor device 1 is a MOSFET (Metal Oxide Semiconductor Field-Effect Transistor). It should be noted that the term MOSFET as used herein denotes any type of field-effect transistor with an insulated gate electrode (often referred to as IGFET) independent of whether the gate electrode includes a metal or another type of electrically conducting material, and independent of whether the gate dielectric includes an oxide or another type of dielectrically insulating material. The circuit symbol of the transistor device 1 shown in FIG. 1 represents an n-type enhancement MOSFET. However, this is just for illustration purposes. Any other type of MOSFET such as a p-type enhancement MOSFET, a p-type depletion MOSFET, an n-type depletion MOSFET, or any other type of field-effect transistor such as an IGBT (Insulated Gate Bipolar Transistor) or a JFET (Junction Field-Effect Transistor) may be used as well.

In a MOSFET, the control node G is also referred to as gate node, the first load node S is also referred to as source node, the second load node D is also referred to as drain node, and the drive voltage $V_{GS}$ is also referred to as gate-source voltage. Although the transistor device 1 shown in FIG. 1 is not restricted to be implemented as a MOSFET, the terms gate node G, source node S and drain node D will be used in the following to denote the control node, the first load node and the second load node, respectively. Further, although in the MOSFET illustrated in FIG. 1, the drive input is formed by the gate node G and the source node S, this is only an example. According to a further example (not illustrated), the drive input is formed by the gate node and an auxiliary source node that is different from the source node. For example, a resistor may be connected to the source node and the drive input may be formed by the gate node and a circuit node of the resistor facing away from the source node.

Figure 2A:
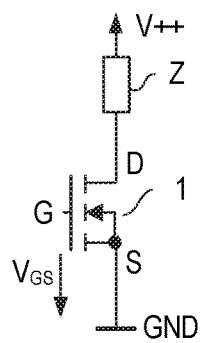
FIGS. 2A-2C show different examples of how the transistor device may be connected to at least one load.
Figure 2B:
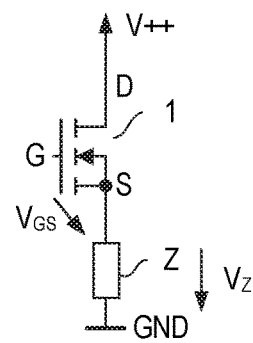
Figure 2C:
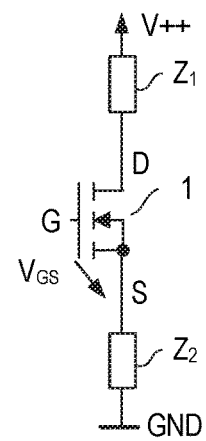

The electronic circuit with the transistor device 1 and the drive circuit 2 may be used as an electronic switch in various types of electronic circuits. Some examples of how the electronic circuit may be used as an electronic switch are illustrated in FIGS. 2A to 2C. For the ease of illustration only the transistor device 1 is shown and the drive circuit 2 is omitted in these figures. Referring to FIG. 2A, the electronic circuit may be used as a low-side switch. In this case, the load path D-S of the transistor device 1 is connected between a load Z and a first supply node where a negative supply potential or ground potential GND is available. The series circuit with the load path D-S of the transistor device 1 and the load Z is connected between the first supply node and a second supply node where a positive supply potential V++ is available.

In the example illustrated in FIG. 2B, the electronic circuit is used as a high-side switch. In this example, the load path D-S of the transistor device 1 is connected between the second supply node (where the positive supply potential V++ is available) and the load Z, wherein the load Z is connected between the first supply node and the load path D-S.

According to another example shown in FIG. 2C, the load path D-S is connected between two loads $Z_1$, $Z_2$, wherein a series circuit that includes the loads $Z_1$, $Z_2$ and the load path D-S is connected between the first supply node and the second supply node.

Figure 3A:
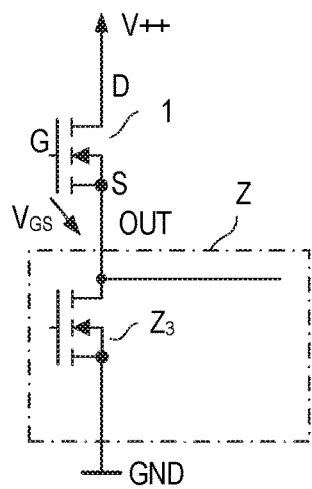
FIGS. 3A-3B show different examples in which the transistor device is one of two transistor devices of a half-bridge.
Figure 3B:
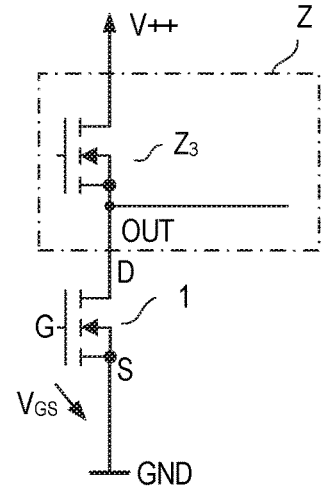

Referring to FIGS. 3A and 3B, the load Z may include a further transistor device $Z_3$ that has its load path connected in series with the load path D-S of the transistor device 1, so that the transistor device 1 and the further transistor device $Z_3$ form a half-bridge. A circuit node common to the load paths of the transistor device 1 and the further transistor device $Z_3$ forms an output OUT of the half-bridge. In the example illustrated in FIG. 3A, the transistor device 1 forms a high-side switch of the half-bridge, and in the example illustrated in FIG. 3B, the transistor device 1 forms a low-side switch of the half-bridge. Half-bridges of the type shown in FIGS. 3A and 3B may be used in various ways to supply a load circuit (not shown in FIGS. 3A and 3B) connected to the output OUT with an alternating voltage. The alternating voltage provided by such half-bridge has a first voltage level when the low-side switch switches off and the high-side switch switches on and a second voltage level when the low-side switch switches on and the high-side switch switches off.

Inevitably, connection lines that connect the load path D-S of the transistor device 1 to supply nodes or the load have an inductance, which may also be referred to as parasitic inductance. Such connection lines can be implemented in various ways. These connection lines may include traces of a printed circuit board (PCB) on which the transistor device may be mounted. According to one example, the transistor device includes a semiconductor body (die) arranged in a housing (package) that includes internal metallizations and contact pads or legs at an outer surface of the package. Such metallizations, contact pads or legs may also include a parasitic inductance. In FIG. 1, those parasitic inductances are represented by a first inductor $L_{p1}$ connected to the drain node D and a second inductor $L_{p2}$ connected to the source node S of the transistor device 1.

Referring to the above, the transistor device 1 can be operated in an on-state or an off-state. The "on-state" is an operating state in which the transistor device 1 conducts a load current $I_{DS}$ different from zero, and the "off-state" is an operating state in which the load current $I_{DS}$ is essentially zero (so that, at most, a leakage current of, for example, several microamperes (µA) can flow. A current level of the load current $I_{DS}$ in the on-state is dependent on a supply voltage received by the series circuit with the transistor device 1 and the at least one load and the type of load. When the transistor device 1 switches from the on-state to the off-state the parasitic inductances $L_{p1}$, $L_{p2}$ in series with the load path D-S may cause voltage overshoots of a load path voltage (drain-source voltage) $V_{DS}$ of the transistor device 1. The "load path voltage D-S" is the voltage between the drain node D and the source node S. In general, the faster the load current $I_{DS}$ decreases and the higher the parasitic inductances $L_{p1}$, $L_{p2}$, the higher those voltage overshoots.

Just for the purpose of explanation it is assumed that the load current $I_{DS}$ is 50 amperes (A) before the transistor device 1 switches off, that the load current $I_{DS}$ decreases at a rate of 60 A/ns when the transistor device 1 switches off, and that the overall parasitic inductance (which is given by $L_{p1}+L_{p2}$) is 300 picohenrys (pH). In this case, a voltage spike of 18 volts (V) (=60 A/ns·300 pH) may occur when the transistor device 1 switches off. The transistor device 1 has to sustain the voltage spike occurring during the transition phase plus a supply voltage, which in the examples illustrated in FIGS. 2A to 2C is given by the voltage between the second supply node and the first supply node. If, for example, the supply voltage is 12 V and the voltage spike is 18 V, the transistor device 1 has to sustain a voltage of 30 V, which is 2.5 times the supply voltage. If the transistor device 1 is designed to only sustain the supply voltage plus a safety margin voltage, the high voltages occurring when switching off the transistor device 1 may operate the transistor device 1 in an avalanche mode. Repetitively operating the transistor device 1 in the avalanche mode, however, may cause irreversible performance degradations of the transistor device. Such performance degradations may include an increase of the on-resistance of the transistor device 1. The "on-resistance" is the electrical resistance between the drain node D and the source node S in the on-state. On the other hand, designing the transistor device 1 such that it is capable of sustaining the high voltages occurring during a switch-off scenario explained before either increases the on-resistance of the transistor device as compared to a transistor device with a lower voltage blocking capability, or increases the size and, therefore, the costs of the transistor device. An increased size, in turn, is associated with a reduced switching speed of the transistor device, that is, the transistor device switches slower from the on-state to the off-state and vice versa. It is therefore desirable to reduce voltage overshoots that may occur when switching off the transistor device 1.

Figure 4:
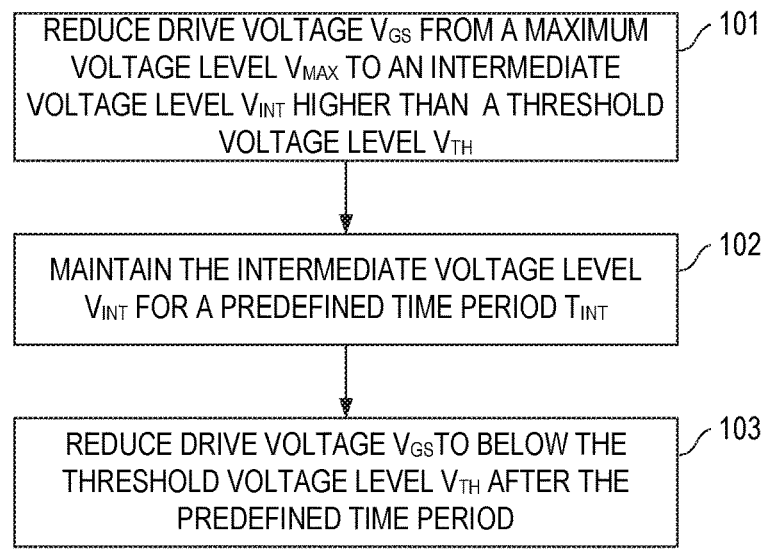
FIG. 4 is a flowchart that illustrates one example of a method for driving the transistor device.

One example of a method that is capable of reducing such voltage overshoots is illustrated in a flowchart shown in FIG. 4. Referring to FIG. 4, this method includes reducing the drive voltage $V_{GS}$ of the transistor device 1 from a maximum voltage level $V_{MAX}$ to an intermediate voltage level $V_{INT}$ that is higher than a threshold voltage level $V_{TH}$ of the transistor device 1 (see 101 in FIG. 4). The method further includes maintaining the intermediate voltage level $V_{INT}$ for a predefined time period $T_{INT}$ (see 102), and reducing the drive voltage $V_{GS}$ to below the threshold voltage level $V_{TH}$ after the predefined time period. In the following, the drive voltage $V_{GS}$ having the maximum (voltage) level is also referred to as maximum drive voltage $V_{MAX}$, the drive voltage $V_{GS}$ having the intermediate (voltage) level is also referred to as intermediate drive voltage $V_{INT}$, and the drive voltage having the threshold voltage level is also referred to as threshold voltage $V_{TH}$. The "threshold voltage level $V_{TH}$" is the voltage level at which the transistor device begins to conduct when the drive voltage $V_{GS}$ increases or stops to conduct when the drive voltage $V_{GS}$ decreases.

Figure 5:
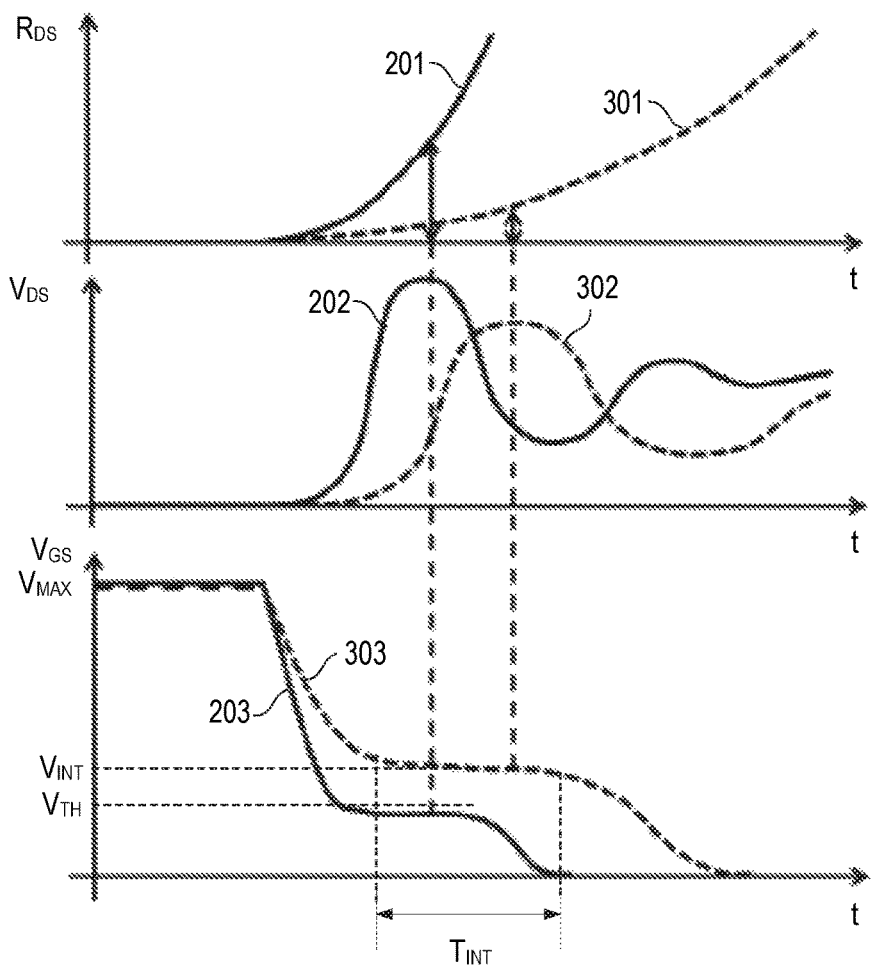
FIG. 5 shows timing diagrams of an on-resistance, a load path voltage and a drive voltage of a transistor device driven in accordance with a method according to FIG. 4 and of a transistor device driven in a conventional fashion.

The effect of the method illustrated in FIG. 4 is shown in FIG. 5 that shows signal diagrams of a load path resistance $R_{DS}$, the load path voltage $V_{DS}$ and the drive voltage $V_{GS}$ of a transistor device driven in accordance with the method shown in FIG. 4. The "load path resistance $R_{DS}$" is the electrical resistance of the transistor device 1 between the drain node D and the source node S. Further, FIG. 5 shows signal diagrams of corresponding signals occurring in a transistor device driven in a conventional fashion. More specifically, curves 301, 302 and 303 shown in FIG. 5 illustrate the load path resistance $R_{DS}$, the load path voltage $V_{DS}$ and the drive voltage $V_{GS}$ of a transistor device driven in accordance with the method shown in FIG. 4, and curves 201, 202 and 203 show the load path resistance $R_{DS}$, the load path voltage $V_{DS}$ and the drive voltage $V_{GS}$ of a transistor device driven in a conventional fashion. The load path resistance $R_{DS}$ has a minimum when the drive voltage $V_{GS}$ has the maximum level $V_{MAX}$. The minimum of the load path resistance $R_{DS}$ is often referred to as on-resistance. According to one example, the transistor device is such that the on-resistance is several milliohms (mΩ), or even lower, and that the load path resistance $R_{DS}$ in the off-state is several hundred kiloohms (kΩ) up to several megaohms (MΩ). When the drive voltage $V_{GS}$ reaches the threshold voltage, the load path resistance $R_{DS}$ is somewhere between the minimum and the maximum.

Referring to FIG. 1, the transistor device includes an internal capacitance $C_{GS}$ (which is usually referred to as gate-source capacitance) between the gate node G and the source node S. The drive voltage $V_{GS}$ (which is often referred to as gate-source voltage) is the voltage across the gate-source capacitance $C_{GS}$. Driving the transistor device 1 in a conventional fashion, as illustrated by curves 201, 202, 203 in FIG. 5, includes rapidly discharging the gate-source capacitance $C_{GS}$, so as to rapidly decrease the drive voltage $V_{GS}$. Due to the so-called Miller effect, the drive voltage $V_{GS}$ remains on a voltage level that is essentially given by the threshold voltage $V_{TH}$ for a while before the drive voltage $V_{GS}$ finally decreases to zero. The load path resistance $R_{DS}$ is low in the on-state, starts to increase before the drive voltage $V_{GS}$ reaches the threshold voltage $V_{TH}$, and dramatically increases after the drive voltage $V_{GS}$ has reached the threshold voltage $V_{TH}$. This rapid increase of the on-resistance $R_{DS\_ON}$ is associated with a rapid increase of the drive voltage $V_{DS}$ and a rapid decrease of the load current $I_{DS}$ (not shown in FIG. 5). This rapid decrease of the load current $I_{DS}$ results in the voltage overshoot explained before. In the example illustrated in FIG. 5, a maximum voltage overshoot occurs during a first period of a parasitic oscillation of the load path voltage $V_{DS}$, wherein this parasitic oscillation is due to a parasitic oscillating circuit that is formed by the parasitic inductances $L_{p1}$, $L_{p2}$ and an output capacitance $C_{DS}$ of the transistor device 1. The "output capacitance $C_{DS}$" is a capacitance $C_{DS}$ between the drain node D and the source node S of the transistor device 1. A frequency of this parasitic oscillation can be in the range of several 100 megahertz (MHz). According to one example, the on-resistance $R_{DS\_ON}$ is several milliohms (mΩ) when the drive voltage $V_{GS}$ has the maximum level $V_{MAX}$.

Referring to curves 301 and 303 shown in FIG. 5, maintaining the drive voltage $V_GS$ at the intermediate level $V_{INT}$ for a predefined time period includes operating the transistor device at load path resistance that is higher than the on-resistance (which is the load path resistance when the transistor device 1 is operated at the maximum drive voltage $V_{MAX}$) but lower than the load path resistance at the threshold voltage $V_{TH}$. Operating the transistor device 1 at the intermediate drive voltage $V_{INT}$ dissipates some of the energy stored in the parasitic inductances $L_{p1}$, $L_{p2}$ before the transistor device 1 finally switches off. In this way, a maximum amplitude of the parasitic oscillation is reduced, as illustrated by curve 302 shown in FIG. 5.

According to one example, the intermediate voltage level $V_{INT}$ is between 1.01 times and 10 times, in particular between 1.1 times and 3 times, the threshold voltage level $V_{TH}$. The intermediate voltage level $V_{INT}$ is essentially constant according to one example. According to another example, the intermediate voltage level $V_{INT}$ decreases during the predefined time period $T_{INT}$. That is, the intermediate voltage level $V_{INT}$ has an upper level $V_{INT\_H}$ at the beginning of the predefined time period $T_{INT}$ and a lower level $V_{INT\_L}$ at the end of the predefined time period $T_{INT}$. According to one example, the upper level $V_{INT\_H}$ is less than 1.3 times, less than 1.2 times, less than 1.1 times, less than 1.05 times, or less than 1.01 times the lower level $V_{INT\_L}$. According to one example, the predefined time period is between 0.1 nanoseconds (ns) and 10 nanoseconds, in particular between 1 nanosecond and 2 nanoseconds.

According to one example, the intermediate voltage level $V_{INT}$ is selected such that a load path resistance $R_{DS\_INT}$ associated with the intermediate voltage $V_{INT}$ is given by $$R_{DS\_INT} = c \cdot \sqrt{\frac{Lp_{TOT}}{C_{DS}}}$$

in order to efficiently dampen the parasitic oscillations, where $Lp_{TOT}$ is an overall parasitic inductance connected in series with the transistor device 1, $C_{DS}$ is the output capacitance value, and c is a proportionality factor. In the example illustrated in FIG. 1, the overall parasitic inductance $Lp_{TOT}$ is given by the sum of the parasitic inductances Lp1, Lp2 ($Lp_{ToT}$=Lp1+Lp2). According to one example, c is selected from a range of between 0.01 and 10, in particular between 0.02 and 5 or between 0.5 and 2. The load path resistance $R_{DS\_INT}$ associated with the intermediate voltage $V_{INT}$" is the load path resistance of the transistor device 1 when the drive voltage $V_{GS}$ has the intermediate level.

According to one example, the intermediate voltage level $V_{INT}$ is selected such that the load path resistance $R_{DS\_INT}$ associated with the intermediate voltage $V_{INT}$ is between 0.01 ohm and 1000 ohms. According to one example, this load path resistance $R_{DS\_INT}$ is higher than 0.1 ohms, or even higher than 0.5 ohms, and lower than 500 ohms, or even lower than 100 ohms. According to another example, this load path resistance $R_{DS\_INT}$ is in the range of between 1 ohm and 5 ohm or between 1 ohm and 2 ohm.

Figure 6:
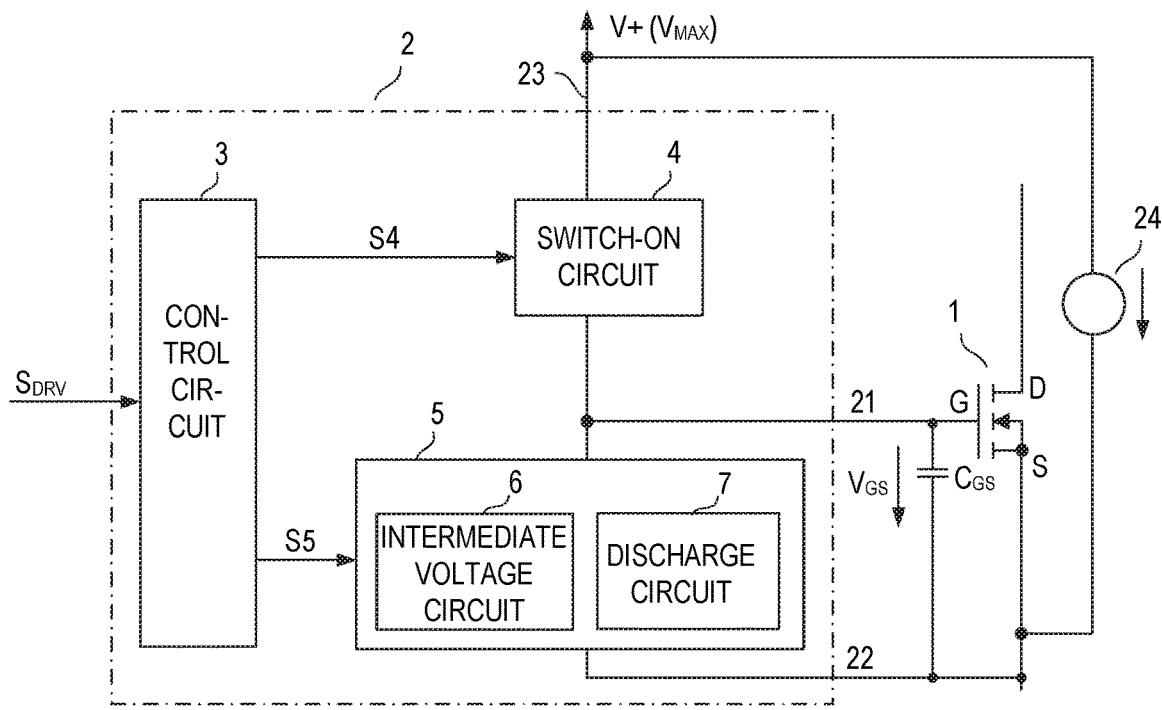
FIG. 6 shows one example of a drive circuit including a control circuit, a switch-on circuit, and a switch-off circuit.

FIG. 6 shows one example of a drive circuit 2 configured to operate the transistor device 1 in accordance with the method illustrated in FIG. 4. More specifically, the drive circuit 2 shown in FIG. 6 is configured to switch off the transistor device 1 in accordance with the method illustrated in FIG. 4.

Referring to FIG. 6, the drive circuit 2 includes a control circuit 3, a switch-on circuit 4, a switch-off circuit 5, a first output node 21, and a second output node 22. The first output node 21 and the second output node 22 of the drive circuit 2 are connected to the drive input of the transistor device 1. More specifically, in the example shown in FIG. 6, the first output node 21 is connected to the gate node G and the second output node 22 is connected to the source node S of the transistor device 1. The drive voltage $V_{GS}$ is the voltage between the first output node 21 and the second output node 22 of the drive circuit 2.

The switch-on circuit 4 is connected between a first output node 21 of the drive circuit 2 and a supply node 23 of the drive circuit 2 and the switch-off circuit 5 is connected between the first output node 21 and the second output node 22 of the drive circuit 2. At the supply node 23, a supply V+ that is referenced to a second output node 22 is available. According to one example, the supply voltage V+ is generated by a voltage source 24 connected between the supply node 23 and the second output node 22. This voltage source 24 is only schematically illustrated in FIG. 6. According to one example, the voltage source includes a bootstrap circuit. The voltage source 24 can be integrated in the drive circuit 2 or can be an external voltage source, so that the supply node 23 may be an internal circuit node of the drive circuit 2 or an external circuit node. According to one example, a voltage level of the supply voltage equals the maximum voltage level $V_{MAX}$.

The control circuit 3 is configured to receive a drive signal $S_{DRV}$ and to control operation of the switch-on circuit 4 and the switch-off circuit 5 based on the drive signal $S_{DRV}$. According to one example, the drive signal $S_{DRV}$ has one of an on-level and an off-level, wherein the on-level indicates that it is desired to switch on the transistor device 1 and the off-level indicates that it is desired to switch off the transistor device 1. According to one example, the control circuit 3 activates the switch-on circuit 4 and deactivates the switch-off circuit in order to switch on the transistor device 1 when the drive signal $S_{DRV}$ has an on-level, and the control circuit 3 activates the switch-off circuit 5 and deactivates the switch-on circuit 4 in order to switch off the transistor device 1 when the drive signal $S_{DRV}$ has an off-level. Activating or deactivating the switch-on circuit 4 by the control circuit 3 includes generating a first control signal S4 by the control circuit 3 and received by the switch-on circuit 4. Further, activating or deactivating the switch-off circuit 5 by the control circuit 3 includes generating a second control signal S5 by the control circuit 3 and received by the switch-off circuit 5. This function of the control circuit 3 is illustrated in FIG. 7 that shows examples of signal diagrams of the drive signal $S_{DRV}$ and the first and second control signals S4, S5.

Figure 7:
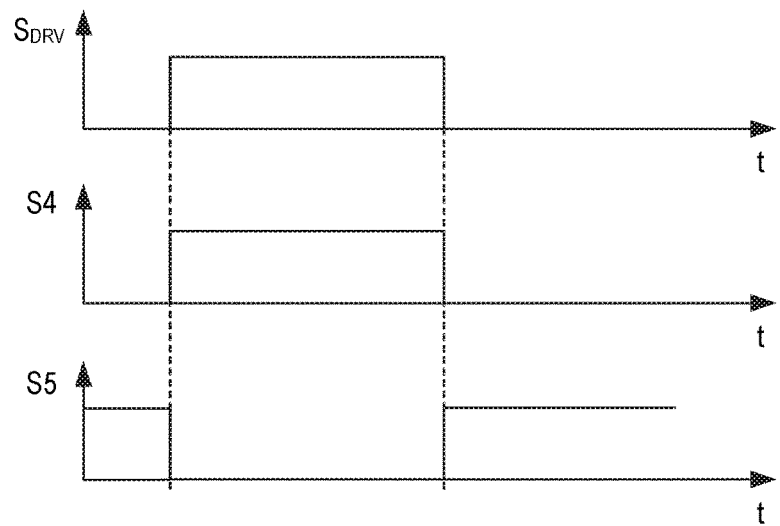
FIG. 7 shows examples of signal diagrams of signals occurring in the drive circuit shown in FIG. 6.

Referring to FIG. 7, the control circuit 3 activates the switch-on circuit 4 by generating an activation level of the first control signal S4 and deactivates the switch-off circuit 5 by generating a deactivation level of the second control signal S5 when the drive signal $S_{DRV}$ has an on-level. Equivalently, the control circuit 3 deactivates the switch-on circuit 4 by generating a deactivation level of the first control signal S4 and activates the switch-off circuit 5 by generating an activation level of the second control signal S5 when the drive signal $S_{DRV}$ has the off-level. The activation level of the first and second control signals S4, S5 is also referred to as on-level and the deactivation level of the first and second control signals S4, S5 is also referred to as off-level in the following. Just for the purpose of illustration, the on-level of the drive signal $S_{DRV}$ and the activation level of the first and second control signals S4, S5 is a high signal level, and the off-level of the drive signal $S_{DRV}$ and the deactivation level of the first and second control signals S4, S5 is low signal level.

Figure 8:
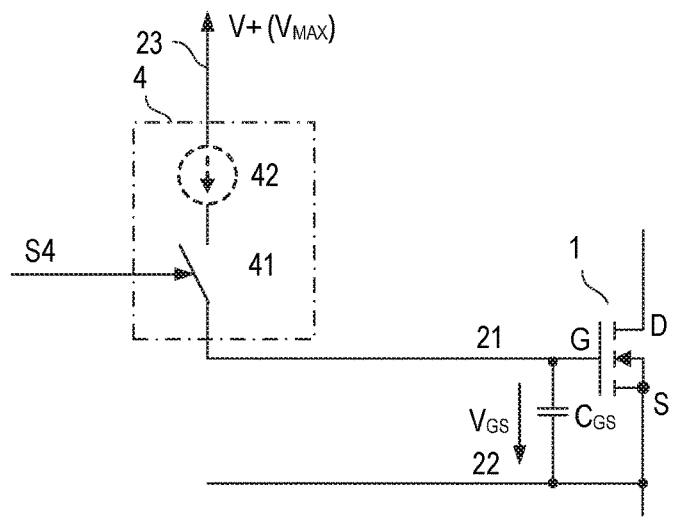
FIG. 8 shows one example of the switch-on circuit.

FIG. 8 shows one example of the switch-on circuit 4. In this example, the switch-on circuit 4 includes an electronic switch 41 connected between the supply node 23 and the first output node 21. This electronic switch 41 is controlled by the control signal S4 received by the switch-on circuit 4 and switches on when the control circuit S4 has the on-level. When the electronic switch 41 switches on a voltage level of the drive voltage $V_{GS}$ essentially equals the voltage level of the supply voltage V+ after the gate source capacitance $C_{GS}$ has been charged. According to one example, the voltage level of the supply voltage V+ is the maximum voltage level $V_{MAX}$ so that the drive voltage $V_{GS}$ has the maximum level $V_{MAX}$ when the switch-on circuit is activated. Optionally, a current source 42 is connected in series with the electronic switch 41. This optional current source defines a current level of a drive current driven into the gate-source capacitance $C_{GS}$ by the switch-on circuit 4. Thus, the optional current source 42 defines how fast the gate-source capacitance $C_{GS}$ is charged to the maximum level and, therefore, how fast the transistor device 1 switches from the off-state to the on-state. According to another example, the current source is omitted and the charging current is defined by the supply voltage and an inevitable on-resistance (which is the resistance in the switched-on state) of the electronic switch 41. The electronic switch 41 can be designed such that it includes a desired on-resistance in order to define the (maximum) charging current. The electronic switch 41 can be implemented using any type of electronic switch. According to one example, the electronic switch 41 is implemented using a transistor device.

Figure 9:
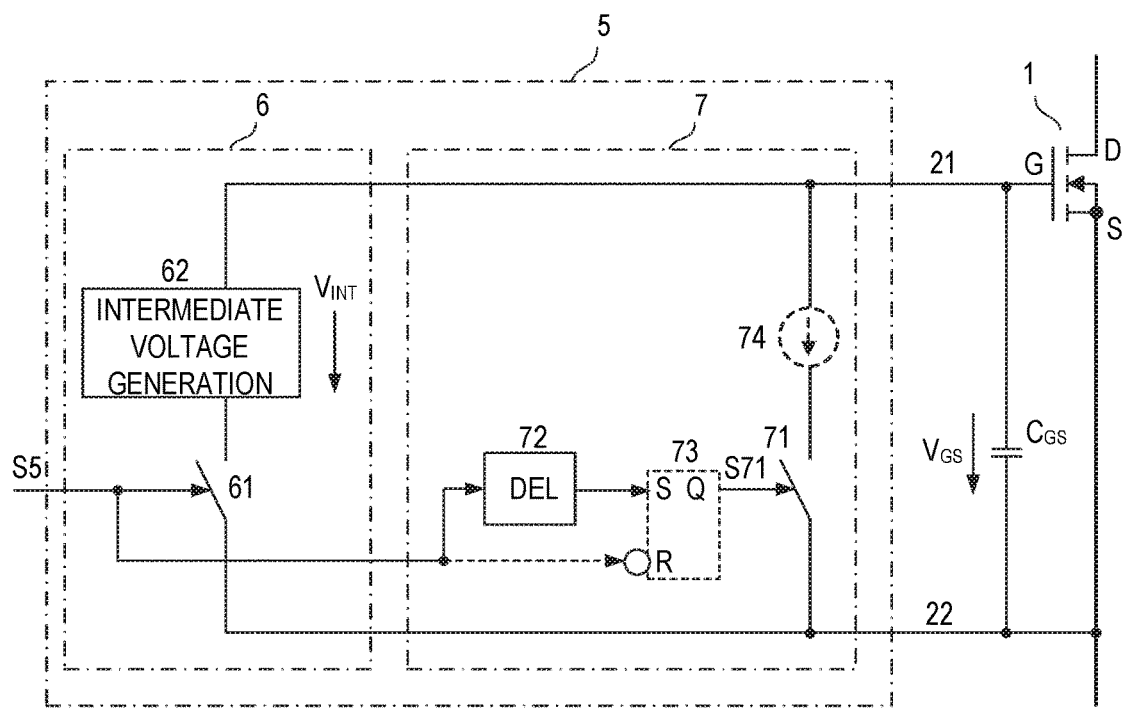
FIG. 9 shows one example of the switch-off circuit.

FIG. 9 shows one example of the switch-off circuit 5. Referring to FIG. 9, the switch-off circuit 5 includes an intermediate voltage circuit 6 and a discharging circuit 7. The intermediate voltage circuit 6 is configured to generate the intermediate voltage $V_{INT}$, and the discharging circuit 7 is configured to finally discharge the gate-source capacitance $C_{GS}$ after the intermediate voltage phase, wherein the intermediate voltage phase is the time period in which the drive voltage $V_{GS}$ is maintained on the intermediate voltage level.

Referring to FIG. 9, the intermediate voltage circuit includes an intermediate voltage generation circuit 62 and an electronic switch 61 connected in series with the intermediate voltage generation circuit 62. A series circuit including the intermediate voltage generation circuit 62 and the electronic switch 61 is connected between the first output node 21 and the second output node 22. The electronic switch 61 of the intermediate voltage circuit 6 receives the second control signal S5, wherein the electronic switch 61 switches on when the control signal S5 has the on-level. The intermediate voltage generation circuit 62 is configured to generate the intermediate voltage $V_{INT}$, wherein the drive voltage $V_{GS}$ essentially equals the intermediate voltage $V_{INT}$ when the second control signal S5 activates the intermediate voltage circuit 6, that is, when the control signal S5 switches on the electronic switch 61. The electronic switch 61 can be implemented using any type of electronic switch. According to one example, the electronic switch 61 is implemented using a transistor device.

Referring to the above, the drive voltage $V_{GS}$ has the maximum level $V_{MAX}$ when the switch-on circuit 4 is activated and the switch-off circuit 5 is deactivated. Thus, the drive voltage $V_{GS}$ has the maximum level $V_{MAX}$ before the second control signal S5 activates the switch-off circuit 5 by switching on the electronic switch 61 of the intermediate voltage circuit 6. Referring to the above, the voltage level of the intermediate voltage $V_{INT}$ is lower than the voltage level of the maximum voltage $V_{MAX}$. Thus, when the electronic switch 61 of the intermediate voltage circuit 6 switches on the drive voltage $V_{GS}$ not immediately equals the intermediate voltage $V_{INT}$. Instead, switching on the electronic switch 61 of the intermediate voltage circuit 6, at first, causes the gate-source capacitance $C_{GS}$ to rapidly discharge until the voltage level of the drive voltage $V_{GS}$ essentially equals the intermediate voltage $V_{INT}$.

Referring to FIG. 9, the discharging circuit 7 includes an electronic switch 71 connected between the first output node 21 and the second output node 22. Optionally, a current source 74 is connected in series with the electronic switch 71, wherein the optional current source 74 defines or limits a discharging current conducted by the electronic switch 71 in the on-state. The discharging circuit 7 shown in FIG. 9 is time-controlled. In this example, the discharging circuit 7 receives the second control signal S5. More specifically, a delay element 72 of the discharging circuit 7 receives the second control signal S5 and switches on (activates) the electronic switch 71 after a delay time after the intermediate voltage circuit 6 has been activated. This is illustrated in FIG. 10.

In the example illustrated in FIG. 9, the delay element 72 is an asymmetrical delay element that delays changes of the signal level of the second control signal S5 from the off-level to the on-level and does not delay changes from the on-level to the off-level. Thus, signal S71 provided by the delay element 72 immediately switches off the electronic switch 71 when the control signal S5 changes from the on-level to the off-level. Alternatively, the delay element 72 delays signal changes from the off-level to the on-level and the on-level to the off-level in the same way. In this case, the discharging circuit 7 additionally includes a latch connected between the delay element 72 and the electronic switch 71. Besides an output signal of the delay element 72 the latch 73 receives the second control signal S5. Further, the latch 73 generates the control signal S71 received by the electronic switch 71. According to one example, the latch 73 is an SR-flip-flop that is set and switches on the electronic switch 71 when an output signal of the delay element 73 changes from the off-level to the on-level. The output signal of the delay element 73 is received by a (non-inverting) set input S of the flip-flop 73 in this example. Further, the flip-flip 73 is reset by the control signal S5 and switches off the electronic switch 71 when the control signal S5 changes from the on-level to the off-level. A reset input R is an inverting input in this example.

Figure 10:
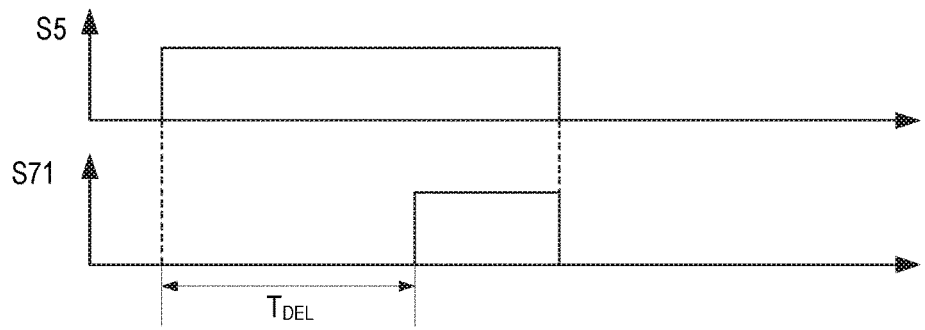
FIG. 10 shows examples of signal diagrams of signals occurring in the switch-off circuit shown in FIG. 9.

FIG. 10 shows signal diagrams of the second control signal S5 and of a drive signal S71 received by the electronic switch 71 from the delay element 72. Just for the purpose of illustration, on-levels of the control signals S5, S71, which are signal levels that switch on the respective switch 61, 71, are high-signal levels and off-levels, which are signal levels that switch off the respective switch 61, 71, are low signal levels in the example shown in FIG. 10. Referring to FIG. 10, the control signal S71 received by the electronic switch 71 in the discharging circuit 7 changes from the off-level to the on-level after a delay time $T_{DEL}$ after the second control signal S5 has changed from the off-level to the on-level. This delay time $T_{DEL}$ defines the time period between activating the intermediate voltage circuit 6 and activating the discharging circuit 7. This delay time $T_{DEL}$ affects the predefined time period $T_{INT}$ explained with reference to FIGS. 4 and 5 in such way that the predefined time period $T_{INT}$ increases when the delay time $T_{DEL}$ increases and that the predefined time period $T_{INT}$ decreases when the delay time $T_{DEL}$ decreases.

The delay time $T_{DEL}$ illustrated in FIG. 10 essentially equals the predefined time period $T_{INT}$, but is not exactly equal the predefined time period $T_{INT}$, because the delay time $T_{DEL}$ includes the predefined time period $T_{INT}$ plus the time it takes to discharge the gate-source capacitance $C_{GS}$ from the maximum level $V_{MAX}$ of the drive voltage $V_{GS}$ to the intermediate level $V_{INT}$. According to one example, the time it takes to discharge the gate-source capacitance $C_{GS}$ from the maximum level $V_{MAX}$ to the intermediate level $V_{INT}$ is less than 20% of the delay time so that the delay time $T_{DEL}$ essentially defines the predefined time period $T_{INT}$. The time it takes to discharge the gate-source capacitance $C_{GS}$ from the maximum voltage level $V_{MAX}$ to the intermediate level $V_{INT}$ can be calculated based on a capacitance value of the gate-source capacitance $C_{GS}$, an on-resistance of the electronic switch 61, the maximum voltage level $V_{MAX}$ and the intermediate level $V_{INT}$ or can be obtained by simulating the circuit. Thus, based on this calculation or simulation and the delay time $T_{DEL}$ the predefined time period $T_{INT}$ can be precisely adjusted.

Figure 11:
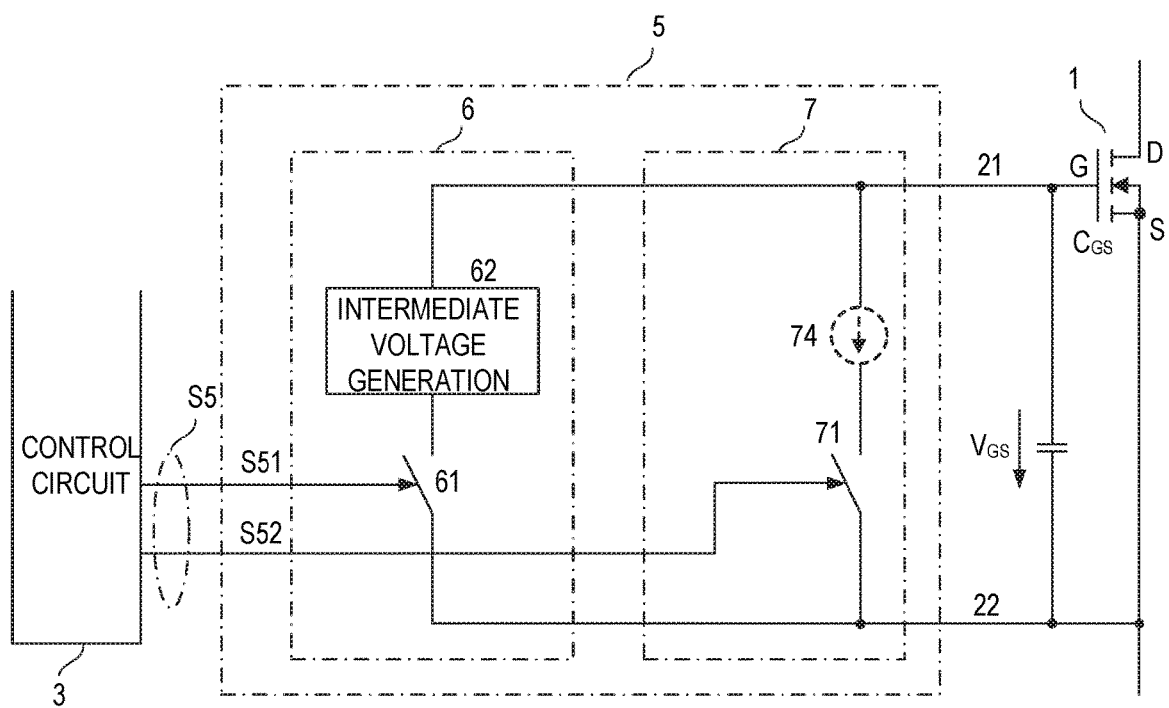
FIG. 11 illustrates one example of an intermediate voltage circuit and a discharging circuit of the switch-off circuit.

FIG. 11 shows another example of the switch-off circuit 5. In this example, the timing of activating the intermediate voltage circuit 6 and the discharging circuit 7 is defined by the control circuit 3. More specifically, the second control signal S5 generated by the control circuit 3 and received by the switch-off circuit 5 includes a first sub-signal S51 received by the intermediate voltage circuit 6 and a second sub-signal S52 received by the discharging circuit 7. In this example, the delay time between activating the intermediate voltage circuit 6 by switching on the electronic switch 61 and activating the discharging circuit 7 by switching on the electronic switch 71 is defined by the control circuit 3.

Figure 12A:
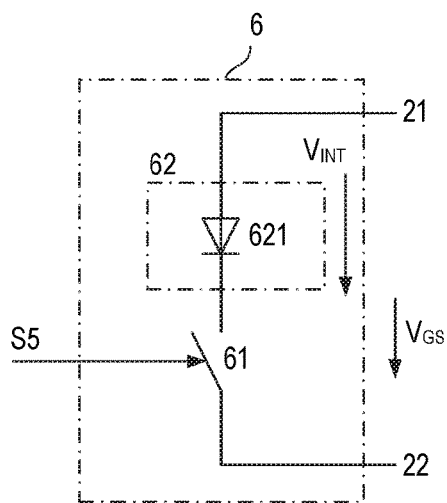
FIGS. 12A-12B show different examples of intermediate voltage generation circuits.
Figure 12B:
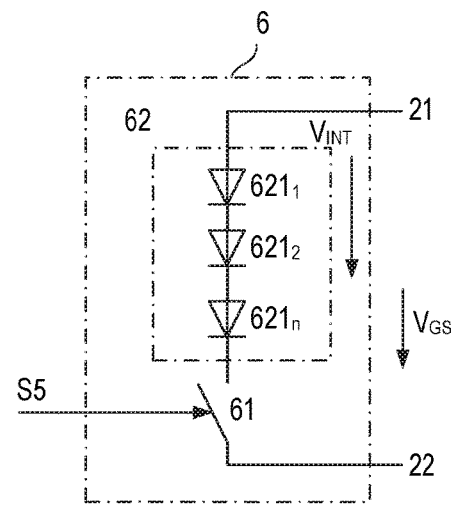

FIG. 12A shows an intermediate voltage generating circuit 62 according to one example. In this example, the intermediate voltage generation circuit 62 includes a bipolar diode 621 connected in series with the electronic switch 61. This bipolar diode 621 is coupled between the first output node 21 and the second output node 22 of the drive circuit 2 such that the diode 621 is forward biased by the drive voltage (gate-source voltage) $V_{GS}$ when the electronic switch 61 is switched on. In this intermediate voltage circuit 6, the intermediate voltage $V_{INT}$ is essentially defined by the forward voltage of the diode 621. FIG. 12B shows a modification of the intermediate voltage circuit 6 shown in FIG. 12A. In the intermediate voltage circuit 6 shown in FIG. 12B, the intermediate voltage generation circuit 62 includes a plurality of bipolar diodes $621_1$-$621_n$ connected in series. These diodes $621_1$-$621_n$ are connected between the first output node 21 and the second output node 22 such that the gate-source voltage $V_{GS}$ forward biases the diodes $621_1$-$621_n$ when the electronic switch 61 is switched on. In this example, the intermediate voltage $V_{INT}$ is essentially given by a sum of the forward voltages of the diodes $621_1$-$621_n$. Just for the purpose of illustration, the intermediate voltage generation circuit 62 includes three diodes $621_1$-$621_n$ in the example shown in FIG. 12B. This, however, is only an example. The number of diodes connected in series can be arbitrary and is dependent on the desired voltage level of the intermediate voltage $V_{INT}$.

Figure 13A:
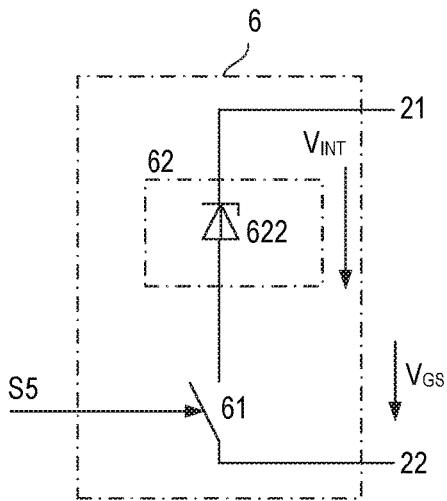
FIGS. 13A-13B show further examples of intermediate voltage generation circuits.
Figure 13B:
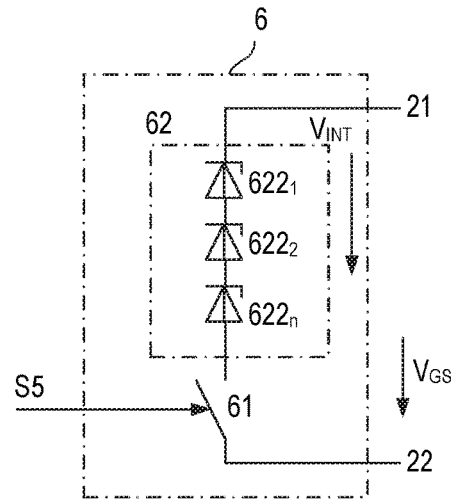

FIG. 13A shows an intermediate voltage generation circuit 62 that is based on the intermediate voltage generation circuit 62 shown in FIG. 12A and is different from the intermediate voltage generation circuit 62 shown in FIG. 12A in that it includes a Zener diode 622 instead of a bipolar diode. This Zener diode 622 is coupled between the first output node 21 and the second output node 22 such that it is reverse biased by the gate-source voltage $V_{GS}$ when the electronic switch 61 is switched on. The voltage level of the intermediate voltage $V_{INT}$ is essentially defined by the breakdown voltage (Zener voltage) of the Zener diode 622. FIG. 13B shows an intermediate voltage generation circuit 62 that is different from the intermediate voltage generation circuit 62 shown in FIG. 13A that it includes a plurality of Zener diodes $622_1$-$622_n$ connected in series. These Zener diodes $622_1$-$622_n$ are reverse biased when the electronic switch 61 is switched on. The voltage level of the intermediate voltage $V_{INT}$ is essentially given by a sum of the Zener voltages of the individual Zener diodes $622_1$-$622_n$ connected in series. Just for the purpose of illustration, three Zener diodes $622_1$-$622_n$ are connected in series in the example shown in FIG. 13B. It goes without saying that an arbitrary number of Zener diodes can be connected in series.

Further, instead of one or more Zener diodes one or more bipolar diodes, Schottky diodes or MOS diodes may be used. It is even possible, to use any combination including at least two different elements selected from a Zener diode, a bipolar diode, a Schottky diodes or a MOS diode.

Figure 14:
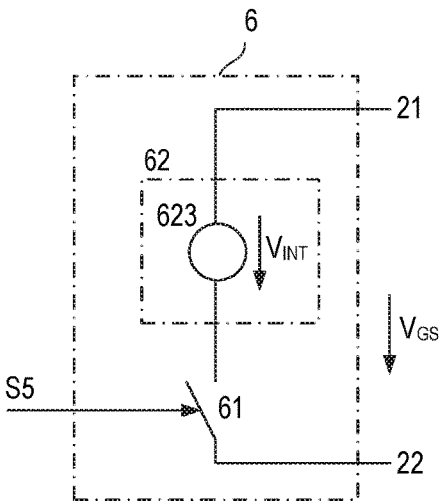
FIG. 14 shows yet another example of an intermediate voltage generation circuit.

FIG. 14 shows an intermediate voltage circuit 6 according to another example. In this example, the intermediate voltage generation circuit 62 includes a voltage source 623 connected in series with the electronic switch 61.

Figure 15:
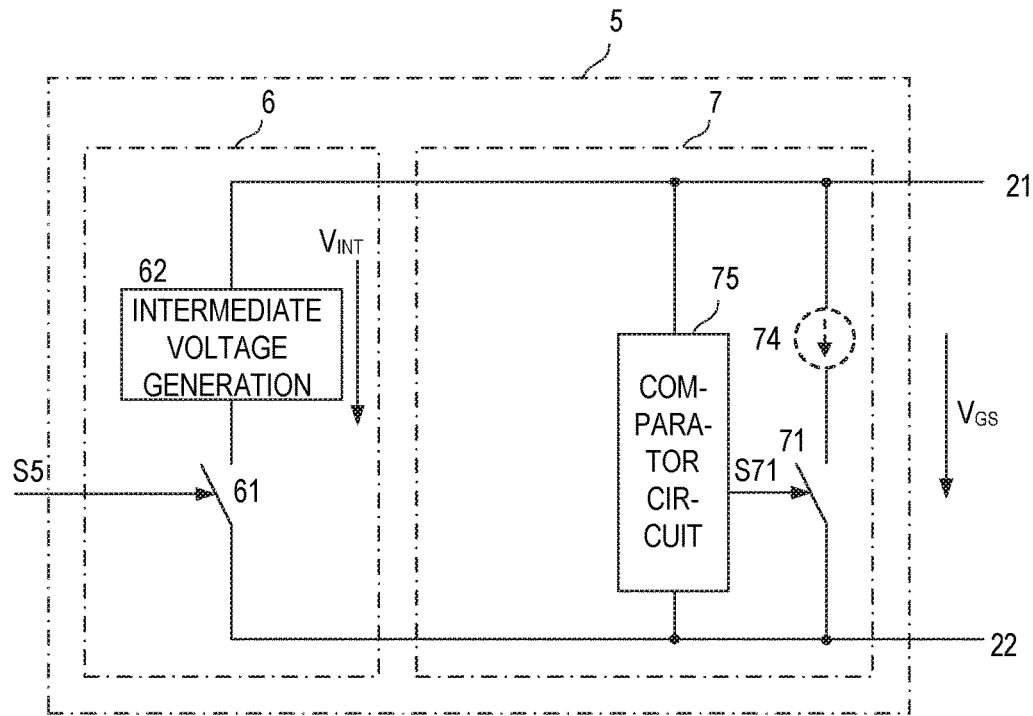
FIG. 15 shows a switch-off circuit with a discharging circuit according to another example.

FIG. 15 shows a discharging circuit 7 according to another example. In this example, the discharging circuit 7 is voltage controlled. More specifically, the electronic switch 71 of the discharging circuit 7 is switched on dependent on a voltage level of the drive voltage $V_{GS}$. For this, the discharging circuit 7 includes a comparator circuit 75 connected between the first output node 21 and the second output node 22. This comparator circuit 75 is configured to detect when the drive voltage $V_{GS}$ falls below a lower intermediate voltage level $V_{INT\_L}$. This is illustrated in FIG. 16.

Figure 16:
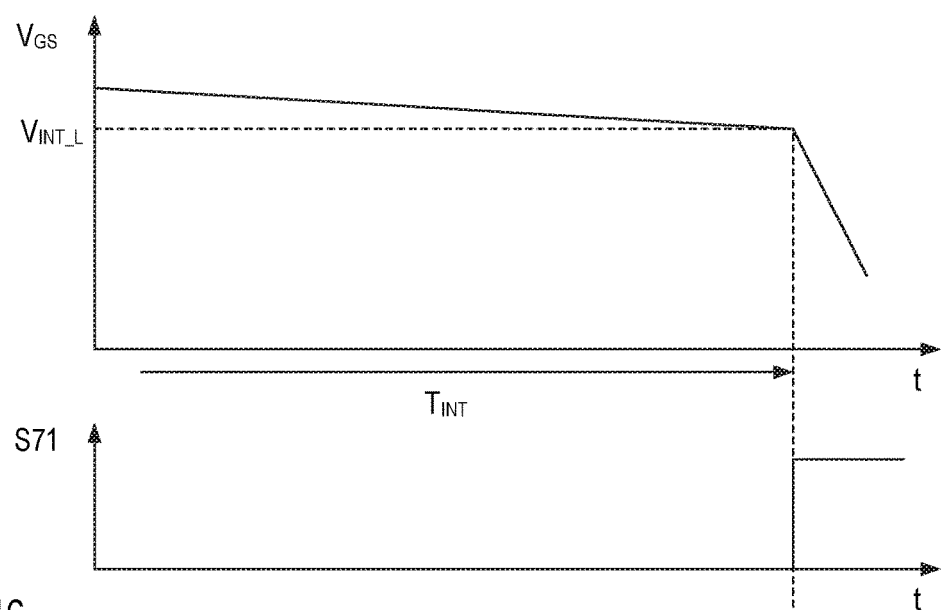
FIG. 16 shows signal diagrams that illustrate the function of the discharging circuit shown in FIG. 15.

FIG. 16 shows signal diagrams of the drive voltage $V_{GS}$ and the control signal S71 received by the electronic switch 71 of the discharging circuit 7 and generated by the comparator circuit 75. In this example, the intermediate voltage circuit 6 generates the intermediate voltage level $V_{INT}$ such that it decreases during the intermediate voltage phase $T_{INT}$. A decreasing intermediate voltage level $V_{INT}$ can be generated, for example, by any of the intermediate voltage generation circuits 62 illustrated in FIGS. 12A, 12B, 13A and 13B. When the intermediate voltage circuit 6 includes an intermediate voltage generation circuit 62 of one of these types discharging the gate-source capacitance $C_{GS}$ slows down as soon as the drive voltage $V_{GS}$ reaches a voltage level defined by the forward voltage of the circuit with the at least one bipolar diode 621, $621_1$-$621_n$ or the Zener voltage of the circuit with the at least one Zener diode 622, $622_1$-$622_n$. Nevertheless, as long as the drive voltage is higher than this forward voltage or the Zener voltage, the gate-source capacitance $C_{GS}$ is slowly discharged and the drive voltage $V_{GS}$ slowly decreases. The lower intermediate voltage level $V_{INT\_L}$ detected by the comparator circuit 75 is either a voltage level as given by the forward voltage or the Zener voltage or is higher than this forward voltage or Zener voltage.

In the switch off-circuit shown in FIG. 15, the predefined time period $T_{INT}$ is given by the time it takes for the drive voltage $V_{GS}$ to decrease from an upper intermediate voltage level $V_{INT\_H}$ not shown in FIG. 16 to the lower intermediate voltage level. This time period can be adjusted, inter alia, by suitably selecting the on-resistance of the electronic switch 61.

Figure 17:
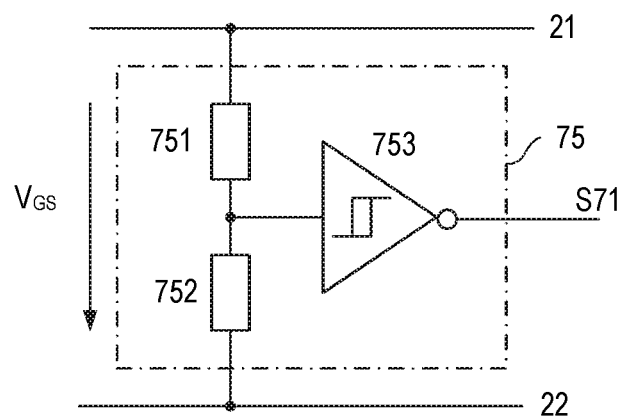
FIG. 17 shows one example of a comparator circuit shown in FIG. 16.

The comparator circuit 75 can be implemented in various ways. According to one example illustrated in FIG. 17, the comparator circuit 75 includes a resistive voltage divider 751, 752 connected between the first output node 21 and the second output node 22 and a Schmitt trigger 753 connected to a tap of the resistive voltage divider. The control signal S71 is provided by an inverting output of the Schmitt trigger 753 according to one example.

Figure 18:
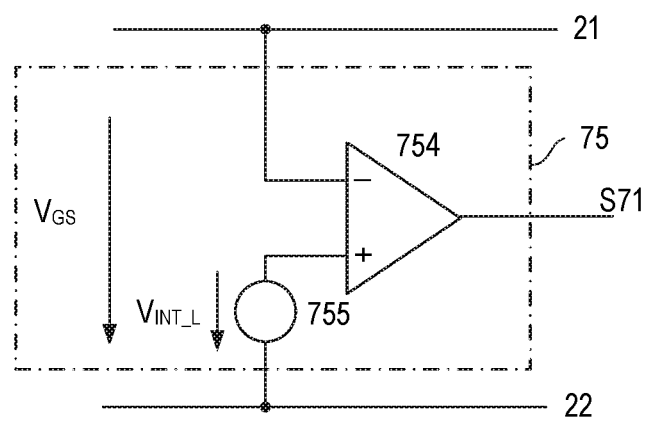
FIG. 18 shows another example of a comparator circuit shown in FIG. 16.

According to another example shown in FIG. 18, the comparator circuit 75 includes a comparator 754 that is configured to compare the drive voltage $V_{GS}$ with a reference voltage provided by a reference voltage source 755. A voltage level of this reference voltage equals the lower intermediate voltage level $V_{INT\_L}$. According to one example, an inverting input of the comparator 754 is connected to the first output node 21 of the drive circuit and a non-inverting input is connected to the second output node 22 via the reference voltage source 755.

Figure 19:
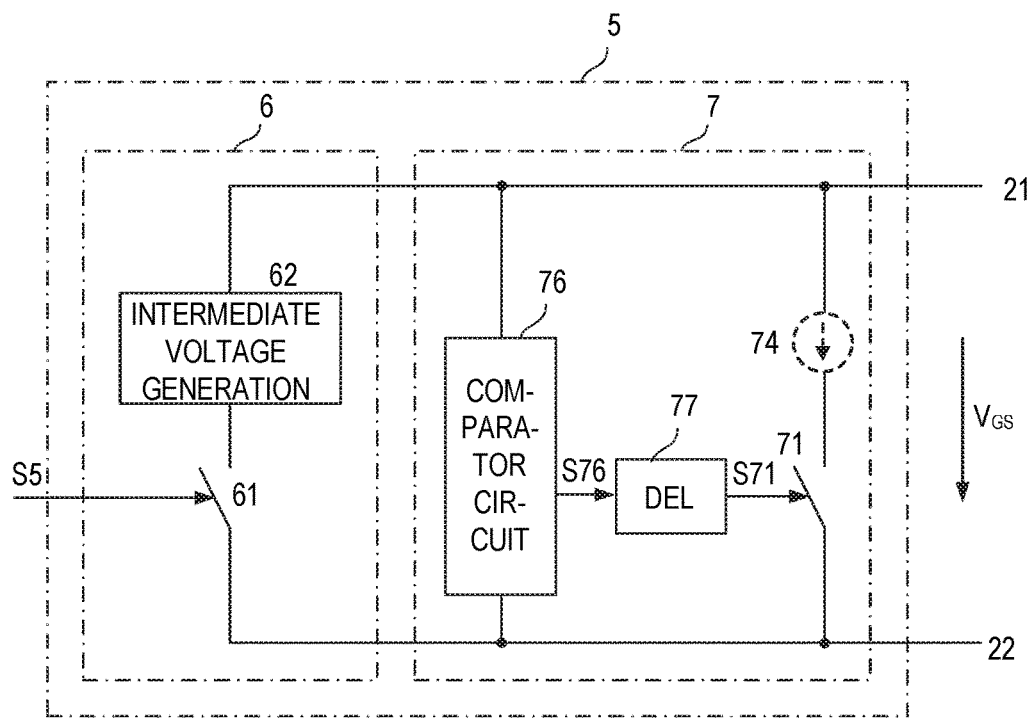
FIG. 19 shows a switch-off circuit with a discharging circuit according to another example.
Figure 20:
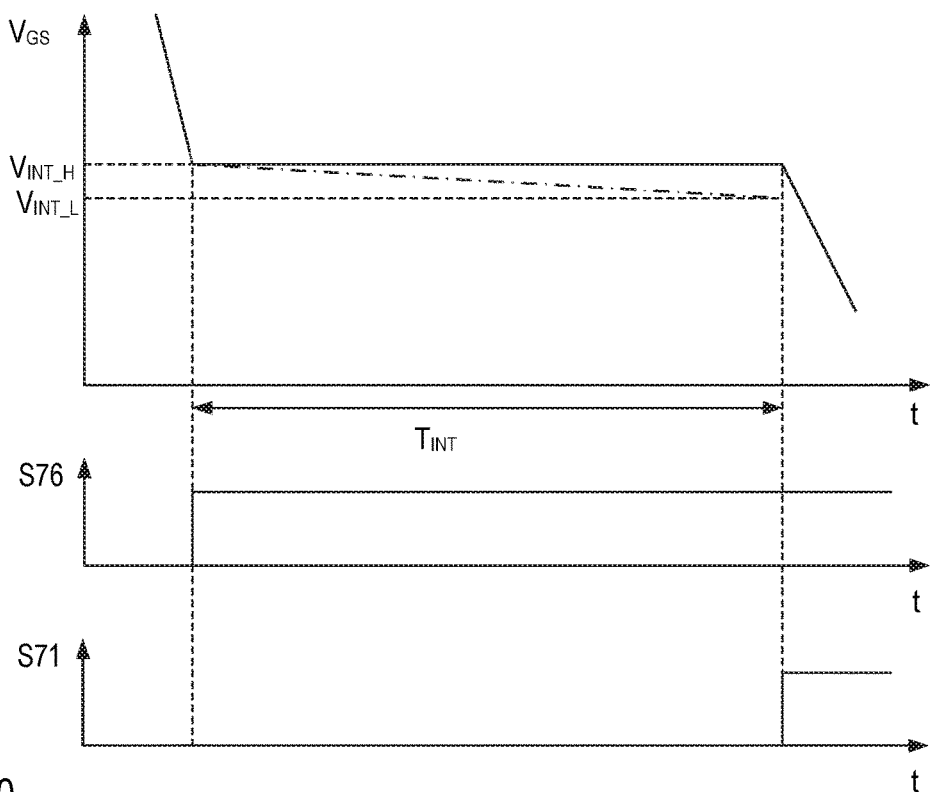
FIG. 20 shows signal diagrams that illustrate the function of the discharging circuit shown in FIG. 19.

FIG. 19 shows a modification of the discharging circuit shown in FIG. 7. In this example, the discharging circuit 7 includes a comparator circuit 76 that is configured to compare a voltage level of the drive voltage $V_{GS}$ with the upper intermediate voltage level $V_{INT\_H}$. A delay element 77 is connected downstream the comparator circuit 76 and is configured to switch on the electronic switch 71 after a predefined delay time after the comparator circuit 76 has detected that the drive voltage $V_{GS}$ has reached the upper intermediate voltage level $V_{INT\_H}$. This function of the discharging circuit 7 is illustrated in FIG. 20 that shows signal diagrams of the drive voltage $V_{GS}$, an output signal S76 generated by the comparator circuit 76 and the control signal S71 received by the electronic switch 71 and generated by the delay element 77. In the example shown in FIG. 20, the output signal S76 of the comparator circuit 76 changes from an off-level to an on-level when the voltage level of the drive voltage $V_{GS}$ reaches the upper intermediate voltage level $V_{INT\_H}$. The delay element 77 generates the on-level of the control signal S71 in order to switch on the electronic switch 71 after a predefined delay time after the signal level of the comparator signal S76 has changed from the off-level to the on-level. In this example, the intermediate voltage circuit 6 can be configured such that the intermediate voltage level $V_{INT}$ is essentially constant during this delay time, as illustrated in solid lines in FIG. 20. However, it is also possible to implement the intermediate voltage circuit 6 such that the intermediate voltage level decreases to the intermediate voltage threshold $V_{INT\_L}$ during this delay time. This is illustrated in dashed and dotted lines in FIG. 20. The upper threshold used by the comparator circuit 76, according to one example, is selected such that it equals the upper intermediate voltage threshold $V_{INT\_H}$ explained herein before. In this example, the predefined time period $T_{INT}$ of the intermediate voltage phase equals the delay time of the delay element 77. The delay element 77 is an asymmetric delay element according to one example. Alternatively, a latch as explained with reference to FIG. 9 may be implemented.

Figure 21:
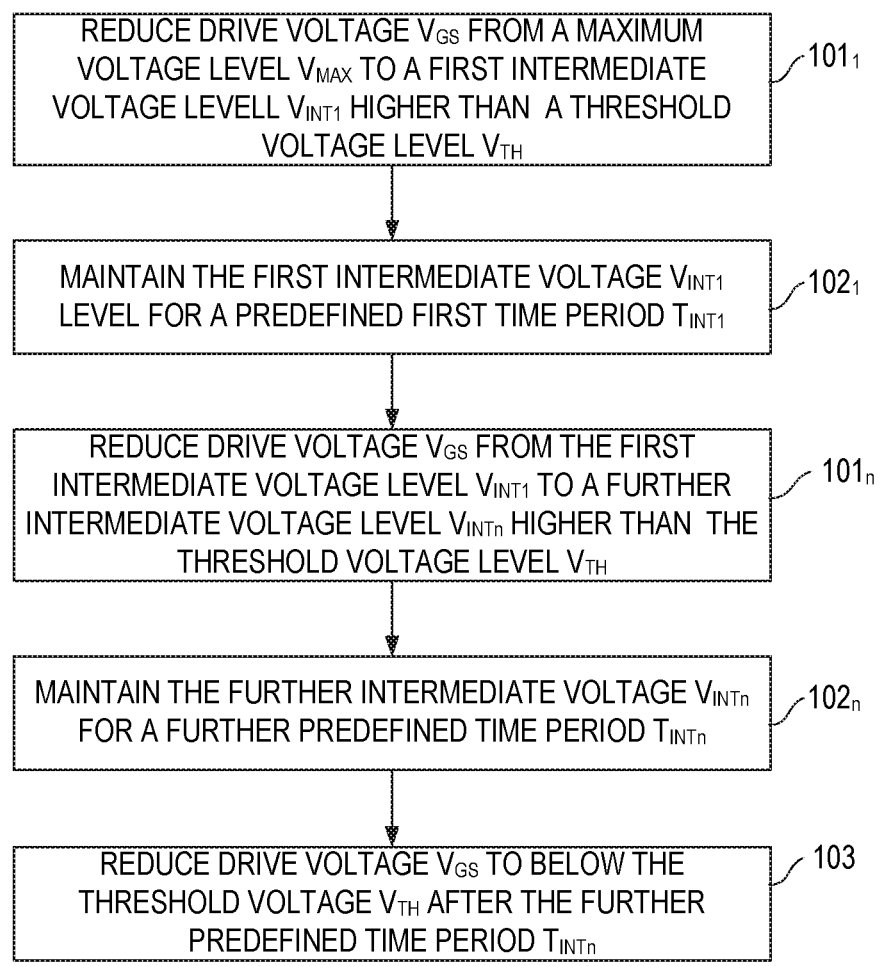
FIG. 21 shows a flowchart of a modified method for driving the transistor device.

FIG. 21 shows a flowchart that illustrates a modification of the method explained herein before. The method according to FIG. 21 includes reducing the drive voltage $V_{GS}$ from the maximum voltage level $V_{MAX}$ to at least two different intermediate voltage levels successively. Referring to FIG. 21, the method includes reducing the drive voltage $V_{GS}$ from the maximum voltage level $V_{MAX}$ to a first intermediate voltage level $V_{INT1}$, and maintaining the first intermediate voltage level $V_{INT1}$ for a predefined first time period $T_{INT1}$ (see method steps $101_1$, $102_1$ in FIG. 21). Further, the method includes reducing the drive voltage $V_{DS}$ from the first intermediate voltage level $V_{INT1}$ to a further intermediate voltage level $V_{INTn}$ higher than the threshold voltage $V_{TH}$, and maintaining the further intermediate voltage level $V_{INTn}$ for a further predefined time period $T_{INTn}$ (see method steps $101_n$, $102_n$ in FIG. 21). Finally, the method includes reducing the drive voltage $V_{GS}$ to below the threshold voltage $V_{TH}$ after the further predefined time period $T_{INTn}$ (see method step 103 in FIG. 21).

The method illustrated in FIG. 21 includes reducing the drive voltage from the maximum voltage level $V_{MAX}$ to below the threshold voltage $V_{TH}$ via two different intermediate voltage levels $V_{INT1}$, $V_{INTn}$, wherein each of these intermediate voltage levels $V_{INT1}$, $V_{INTn}$ is maintained for a respective time period $T_{INT1}$, $T_{INTn}$. Using two different intermediate voltages $V_{INT1}$, $V_{INTn}$, however, is only an example. In general, an arbitrary number of intermediate voltages can be implemented. According to one example, the number of different intermediate voltages is selected from between two and five.

Figure 22:
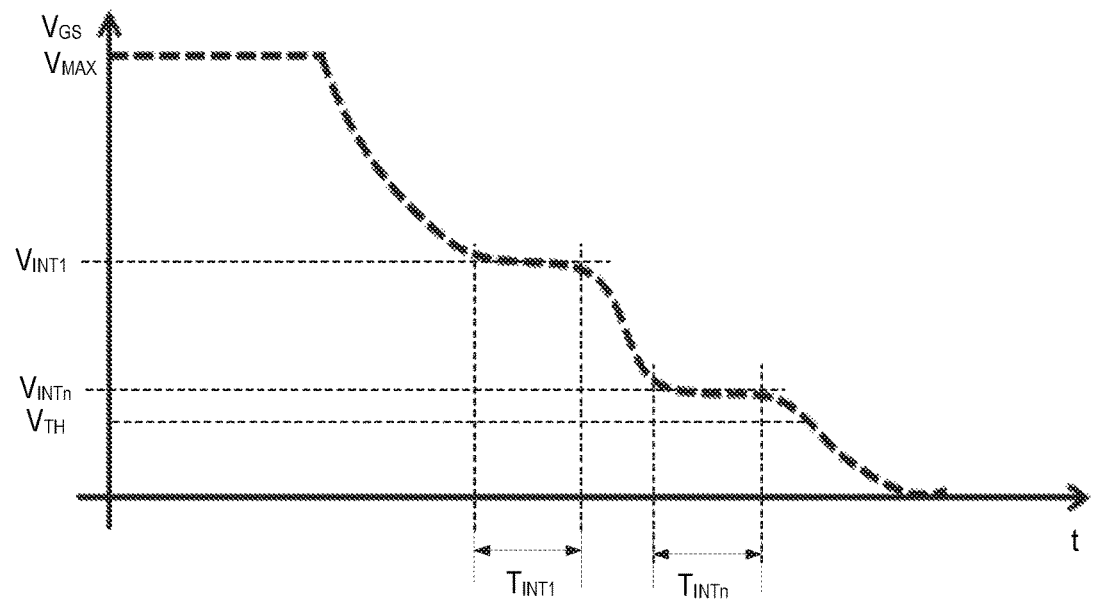
FIG. 22 shows a signal diagram of a drive voltage of a transistor device operated in accordance with a method as illustrated in FIG. 21.

FIG. 22 shows one example of a signal diagram of the drive voltage $V_{GS}$ of a transistor device 1 operated in accordance with the method illustrated in FIG. 21. As can be seen from FIG. 22, the drive voltage $V_{GS}$, in this example, is reduced from the maximum level $V_{MAX}$ to the first intermediate level $V_{INT1}$ where it remains for a first time period $T_{INT1}$. Further, the drive voltage $V_{GS}$, after the first time period $T_{INT1}$, is reduced from the first intermediate level $V_{INT1}$ to the further intermediate level $V_{INTn}$ where it remains for the further time period $T_{INTn}$ before the drive voltage $V_{GS}$ is reduced to below the threshold voltage $V_{TH}$ in order to switch off the transistor device.

Figure 23:
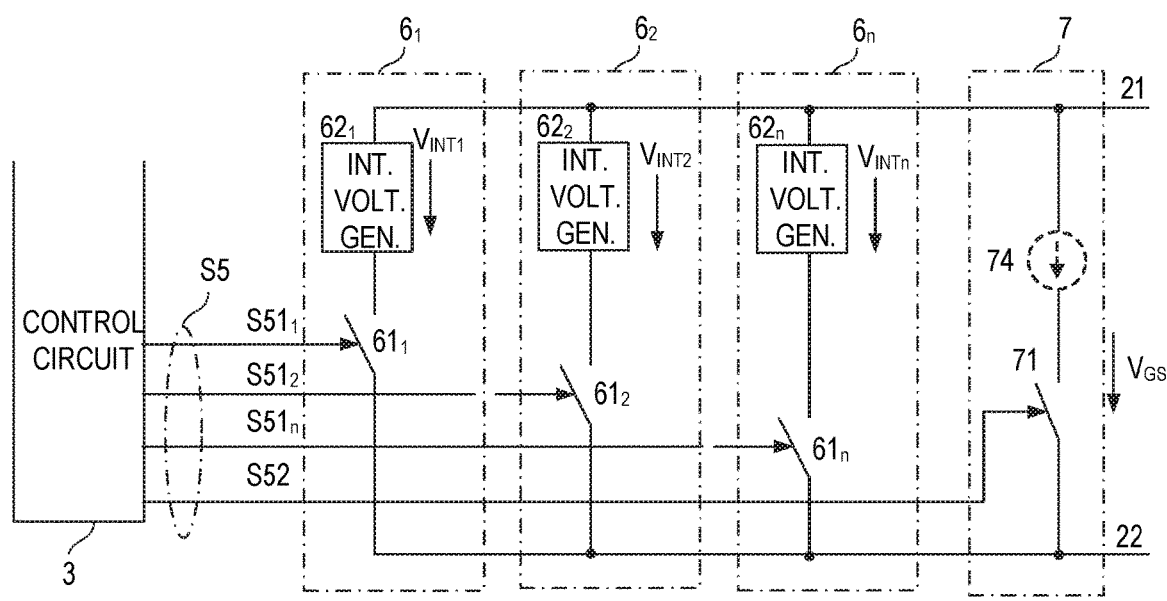
FIG. 23 shows one example of a switch-off circuit of a drive circuit that is configured to operate the transistor device in accordance with the method illustrated in FIG. 21.

FIG. 23 shows one example of a switch-off circuit 5 that is configured to switch off a transistor device in accordance with the method explained with reference to FIGS. 21 and 22. This switch-off circuit 5 includes a plurality of intermediate voltage circuits $6_1$-$6_n$, wherein each of these intermediate voltage circuits $6_1$-$6_n$ is implemented in accordance with the intermediate voltage circuit 6 explained herein before and includes an intermediate voltage generation circuit $62_1$-$62_n$ and an electronic switch $61_1$-$61_n$ connected in series with the intermediate voltage generation circuit $62_1$-$62_n$. These intermediate voltage generation circuits $62_1$-$62_n$ are implemented such that they generate different intermediate voltages $V_{INT1}$, $V_{INT2}$, $V_{INTn}$. Each of these intermediate voltage circuits $6_1$-$6_n$ is activated by a respective control signal $S51_1$-$S51_n$ received by the respective electronic switch $61_1$-$61_n$ from the control circuit 3 (not shown in FIG. 23).

Just for the purpose of illustration, the switch-off circuit 5 shown in FIG. 23 includes three intermediate voltage circuits $6_1$-$6_n$, so that using this switch-off circuit 5 up to three different intermediate voltage levels can be generated successively when switching off the transistor device 1. Implementing three intermediate voltage circuits, however, is only an example. An arbitrary number of different intermediate voltage levels $6_1$-$6_n$ can be implemented.

In the switch-off circuit 5 shown in FIG. 23 a timing of activating the different intermediate voltage circuits $6_1$-$6_n$ is defined by the control circuit 3. Further, in this example, the control circuit 3 controls the discharging circuit 7 by generating the drive signal S52 received by the electronic switch 71 of the discharging circuit 7. Thus, the timing of activating the discharging circuit 7 relative to activating the intermediate voltage circuits $6_1$-$6_n$ is also defined by the control circuit 3.

Figure 24:
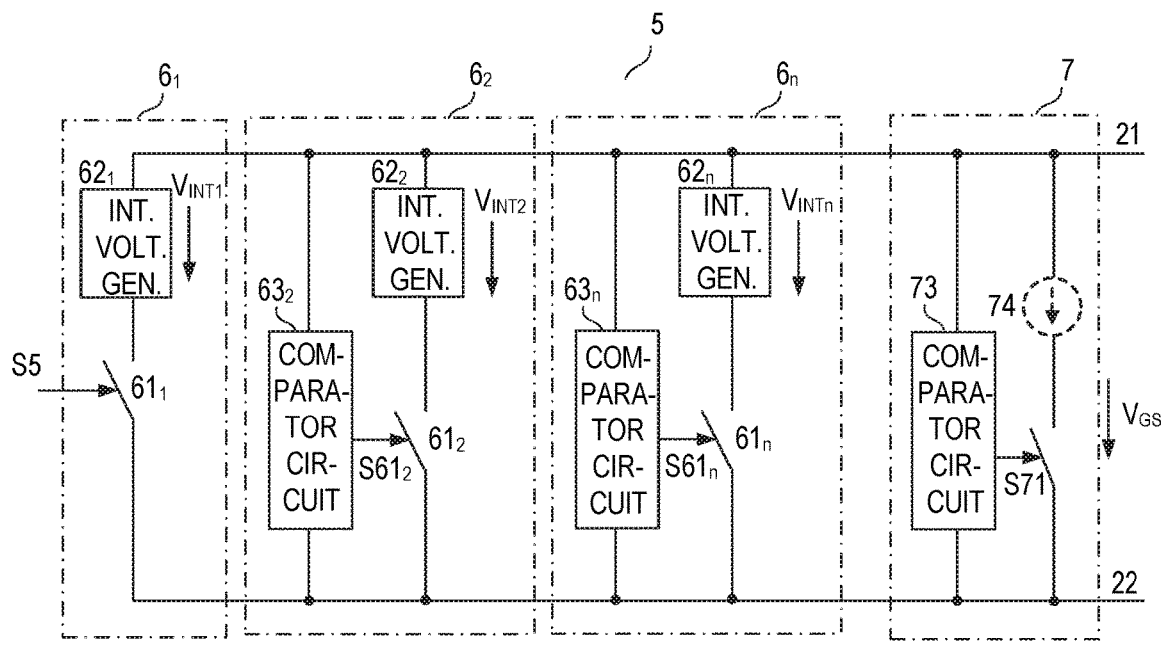
FIG. 24 shows a modification of the switch-off circuit shown in FIG. 23.

FIG. 24 shows a switch-off circuit 5 according to another example. This switch-off circuit 5 is based on the switch-off circuit shown in FIG. 23 and is different from the switch-off circuit shown in FIG. 23 in that only a first intermediate voltage circuit $6_1$ of the plurality of intermediate voltage circuits $6_1$-$6_n$ receives the control signal S5 from the control circuit (not shown in FIG. 24, while the other ones $6_2$-$6_n$ of the plurality of intermediate voltage circuits $6_1$-$6_n$ and the discharging circuit 7 are voltage controlled. That is, each of these intermediate voltage circuits $6_2$-$6_n$ includes a comparator circuit $63_2$-$63_n$ that detects the drive voltage $V_{GS}$ and activates the respective intermediate voltage circuit $6_2$-$6_n$ when the drive voltage $V_{GS}$ has fallen below a respective lower intermediate voltage level $V_{INT1\_L}$, $V_{INT2\_L}$. The discharging circuit 7 includes a comparator circuit 73 that detects the drive voltage $V_{GS}$ and activates the discharging circuit 7 when the drive voltage $V_{GS}$ reaches another intermediate voltage level $V_{INTn\_L}$. The intermediate voltage circuits $6_1$-$6_n$ shown in FIG. 24 are referred to as first, second, and third intermediate voltage circuits in the following.

Figure 25:
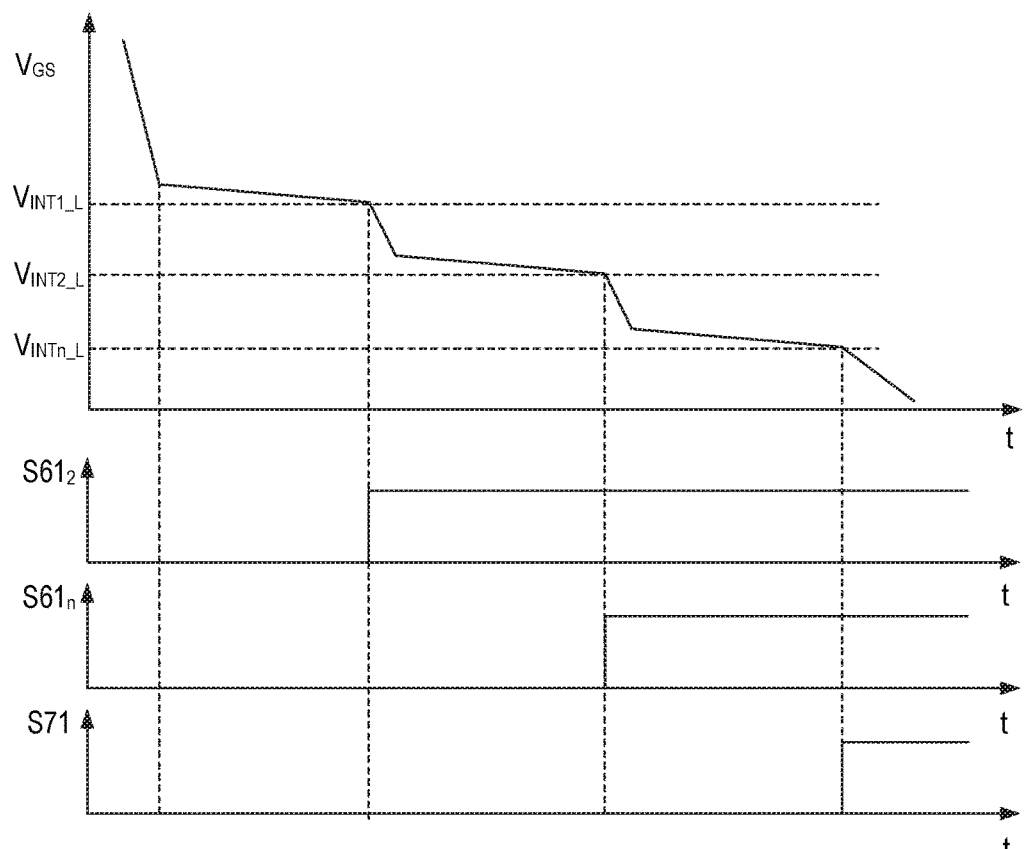
FIG. 25 shows signal diagrams that illustrate the function of the switch-off circuit shown in FIG. 24.

The function of the switch-off circuit 5 shown in FIG. 24 is illustrated in FIG. 25 that shows signal diagrams of the drive voltage $V_{GS}$ and of the switch control signals $S61_2$, $S61_n$ generated by the comparator circuits $63_2$, $63_n$ in the intermediate voltage circuits $6_2, 6_3$ and of the switch control signal S71 generated by the comparator circuit 73 in the discharging circuit 7. Referring to FIG. 25, the comparator circuit $63_2$ in the second intermediate voltage circuit $6_2$ activates the second intermediate voltage circuit $6_2$ when the drive voltage $V_{GS}$ falls below a lower level $V_{INT1\_L}$ of the intermediate voltage $V_{INT1}$ generated by the first intermediate voltage circuit $6_1$. Further, the comparator circuit $63_n$ in the third intermediate voltage circuit $6_n$ activates the third intermediate voltage circuit $6_n$ when the drive voltage $V_{GS}$ falls below a lower level $V_{INT2\_L}$ of the intermediate voltage generated by the second intermediate voltage circuit $6_2$. Finally, the comparator circuit 73 of the discharging circuit 7 activates the discharging circuit when the drive voltage $V_{GS}$ falls below a lower level $V_{INTn\_L}$ of the intermediate voltage $V_{INTn}$ generated by the third intermediate voltage circuit $6_n$. Just for the purpose of illustration, in the example shown in FIG. 25, activating the intermediate voltage circuits $6_2$, $6_n$ and the discharging circuit 7 is equivalent to a high signal level of the respective control signal $S61_2$, $S61_n$, S71.

Figure 26:
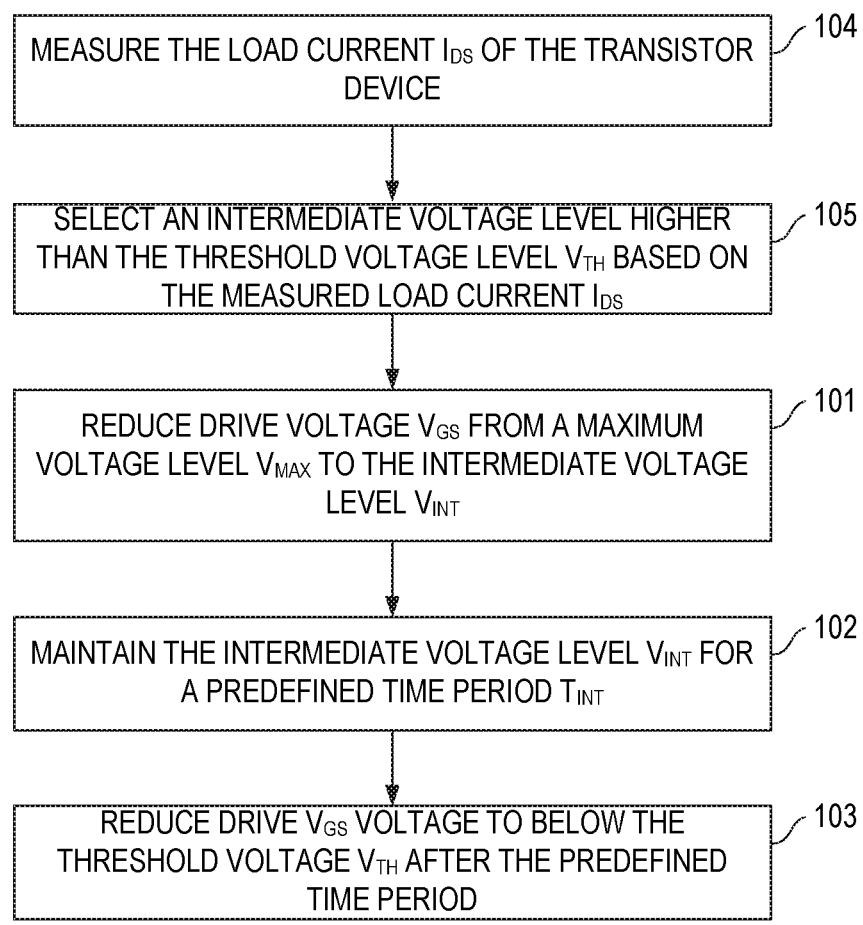
FIG. 26 is a flowchart that illustrates a modification of the method illustrated in FIG. 4.

FIG. 26 shows a further modification of the method explained with reference to FIG. 4. The method according to FIG. 26, before reducing the drive voltage $V_{GS}$ from the maximum voltage level $V_{MAX}$ to the intermediate voltage $V_{INT}$, includes measuring the load current $I_{DS}$ of the transistor device (see method step 104) and selecting the intermediate voltage based on the measured load current $I_{DS}$. In an electronic circuit of the type explained herein before, the amount of energy stored in the parasitic inductances $Lp_2$, $Lp_2$ increases as the load current $I_{DS}$ increases. According to one example, the intermediate voltage $V_{INT}$ is selected from a plurality of different intermediate voltages such that the intermediate voltage increases as the load current $I_{DS}$ increases. Referring to the above, the lower the intermediate voltage, the higher the on-resistance of the transistor device 1 during the intermediate phase. Thus, higher load currents $I_{DS}$ are associated with a lower on-resistance during the intermediate phase in order to dissipate power stored in the parasitic inductances $L_{P1}$, $L_{P2}$ in the transistor device 1 during the intermediate phase.

Figure 27:
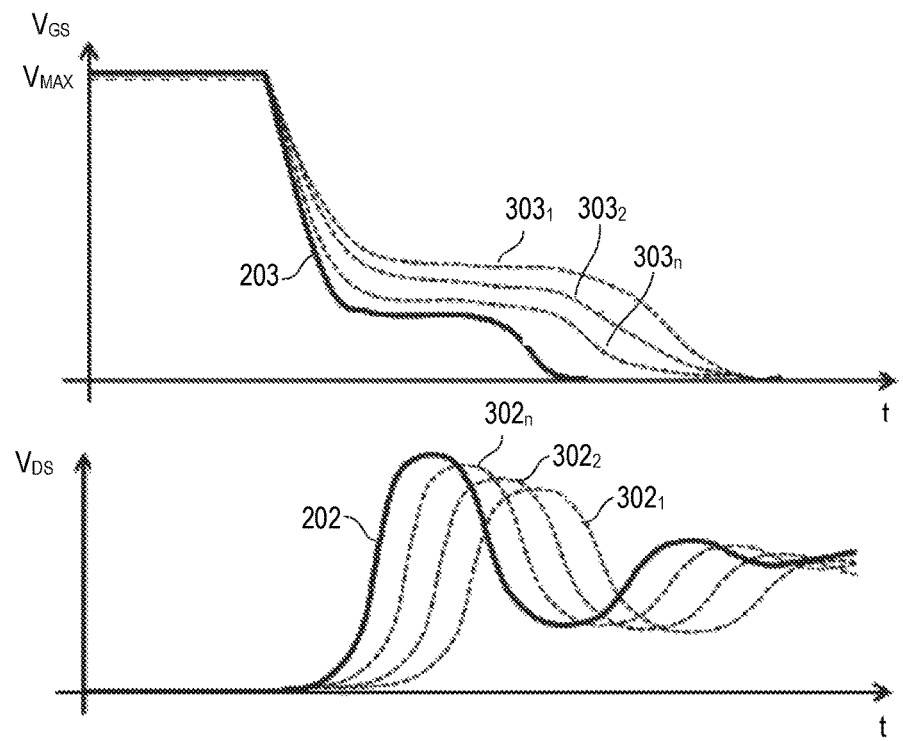
FIG. 27 shows a signal diagram of a drive voltage and a load path voltage of a transistor device driven in accordance with the method illustrated in FIG. 26.

FIG. 27 shows signal diagrams of the drive voltage $V_{GS}$ and the load path voltage $V_{DS}$ when conventionally switching off the transistor device 1, that is, without intermediate phase (see curves 203, 202 in FIG. 27) and when switching off the transistor device using one of several different intermediate voltages. Curve $303_1$ illustrates switching off the transistor device $V_{GS}$ using a first intermediate voltage and curve $302_1$ shows the associated load path voltage $V_{DS}$. Curve $303_2$ illustrates switching off the transistor device using a second intermediate voltage that is lower than the first intermediate voltage $303_1$ and curve $302_2$ shows the associated load path voltage $V_{DS}$. Further, curve $303_n$ illustrates switching off the transistor device using a third intermediate voltage that is lower than the second intermediate voltage $303_2$ and curve $302_n$ shows the associated load path voltage $V_{DS}$. It can be seen from FIG. 27 that the amplitude of the parasitic oscillations decreases as the intermediate voltage increases. It should be noted that the curves shown in FIG. 27 have been obtained by the same load current $I_{DS}$ and different intermediate voltages.

Figure 28:
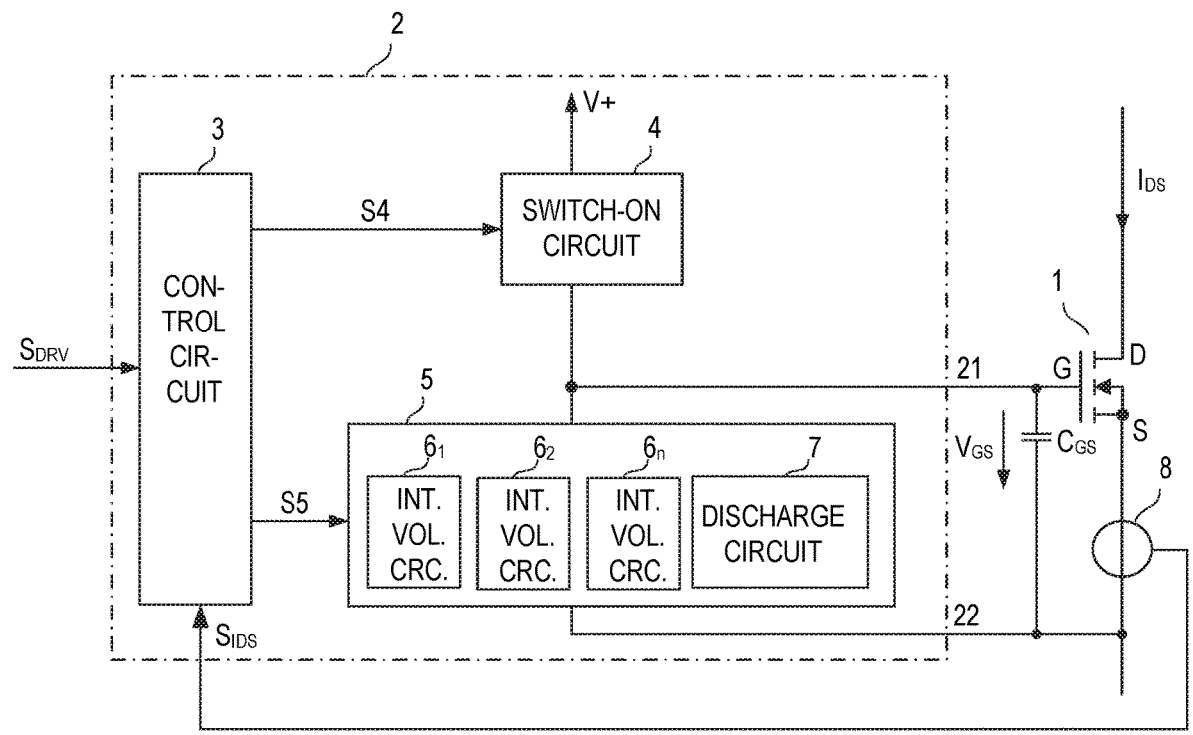
FIG. 28 shows one example of a drive circuit configured to drive the transistor device in accordance with the method illustrated in FIG. 26.

FIG. 28 shows one example of a drive circuit 2 that is configured to operate the transistor device in accordance with the method illustrated in FIGS. 26 and 27. This drive circuit is different from the drive circuits explained herein before in that the control circuit 3 receives a load current signal $S_{IDS}$ that represents the load current $I_{DS}$ through the transistor device 1. This load current signal $S_{IDS}$ can be obtained using any type of conventional current measurement circuit that is configured to measure the current through a transistor device 1. Such current measurement circuits are commonly known so that no further explanations are required in this regard. A current measurement circuit 8 measuring the load current $I_{DS}$ and generating the load current signal $S_{IDS}$ is schematically illustrated in FIG. 28.

Further, referring to FIG. 28, the switch-off circuit 5 includes a plurality of intermediate voltage circuits $6_1$-$6_n$, wherein the control circuit 3 is further configured to activate one of these intermediate voltage circuits $6_1$-$6_n$ dependent on the load current signal $S_{IDS}$. Using the switch-off circuit 5 shown in FIG. 28, the transistor device 1 is switched off dependent on the load current $I_{DS}$ that flows through the transistor device 1 in the on-state before switching off the transistor device 1.

Figure 29:
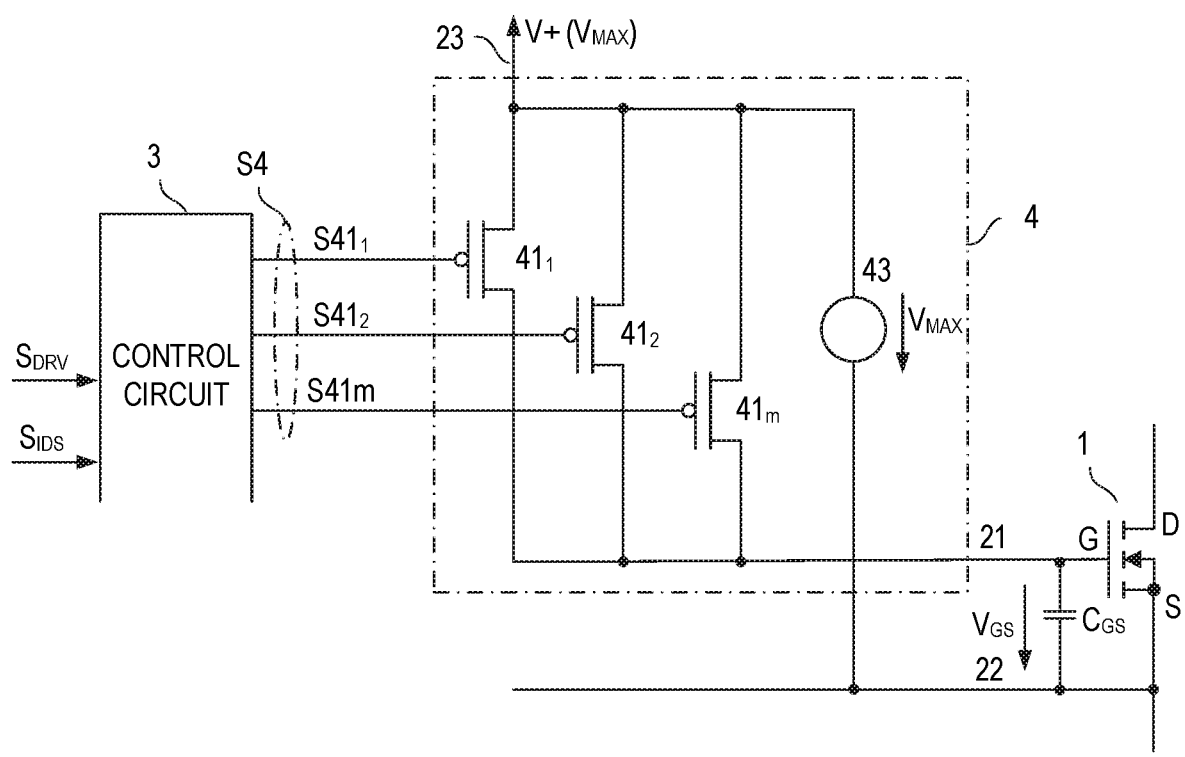
FIG. 29 shows one example of the switch-on circuit shown in FIG. 28.

According to one example, not only switching off the transistor device 1 but also switching on the transistor device 1 is dependent on the load current $I_{DS}$ that was measured before the transistor device 1 switched off. An example of a switch-on circuit 4 that is configured to switch on the transistor device 1 dependent on the load current $I_{DS}$ is shown in FIG. 29. In this example, the switch-on circuit 4 includes a plurality of electronic switches $41_1$-$41_m$. These electronic switches $41_1$-$41_m$ are connected in parallel between the supply node 23 and the first output node 21. Further, these electronic switches $41_1$-$41_m$ have different on-resistances. According to one example, these electronic switches 41-$41_m$ are implemented as MOSFETs such as p-type MOSFETs. The control circuit 3 that receives the load current signal $S_{IDS}$ is configured to switch on at least one of these electronic switches $41_1$-$41_m$ when the drive signal $S_{DRV}$ indicates that it is desired to switch on the transistor device 1. According to one example, the control circuit 3 is configured to select the at least one electronic switch $41_1$-$41_m$ that is switched on by the control circuit 3 such that the higher the load current $I_{DS}$ that was detected before the transistor device 1 switched off, the higher the resistance between the supply node and the first output node 21 in the on-state of the at least one electronic switch selected by the control circuit 3. In this way, the higher the load current $I_{DS}$, the slower the transistor device 1 switches on.

Figure 30:
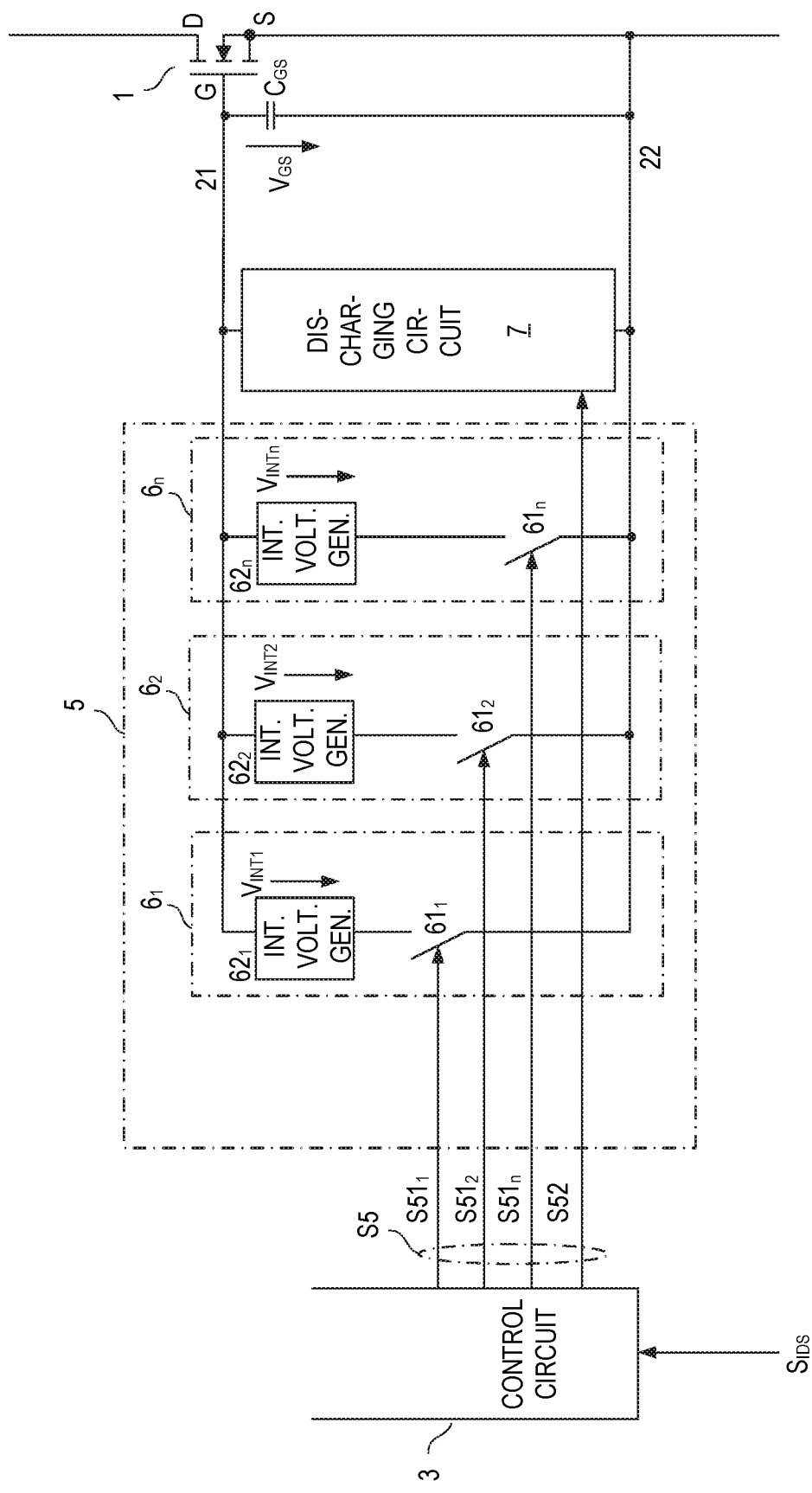
FIG. 30 shows one example of the switch-off circuit shown in FIG. 28.

FIG. 30 shows one example of the switch-off circuit 5. In this example, each of the intermediate voltage circuits $6_1$-$6_n$ is implemented in the way explained with reference to FIG. 9. The discharging circuit 7 can be implemented in accordance with any of the examples explained herein before. In the example shown in FIG. 13, a timing of activating one of the intermediate voltage circuits $6_1$-$6_n$ and the discharging circuit 7 is controlled by the control circuit 3.

Figure 31:
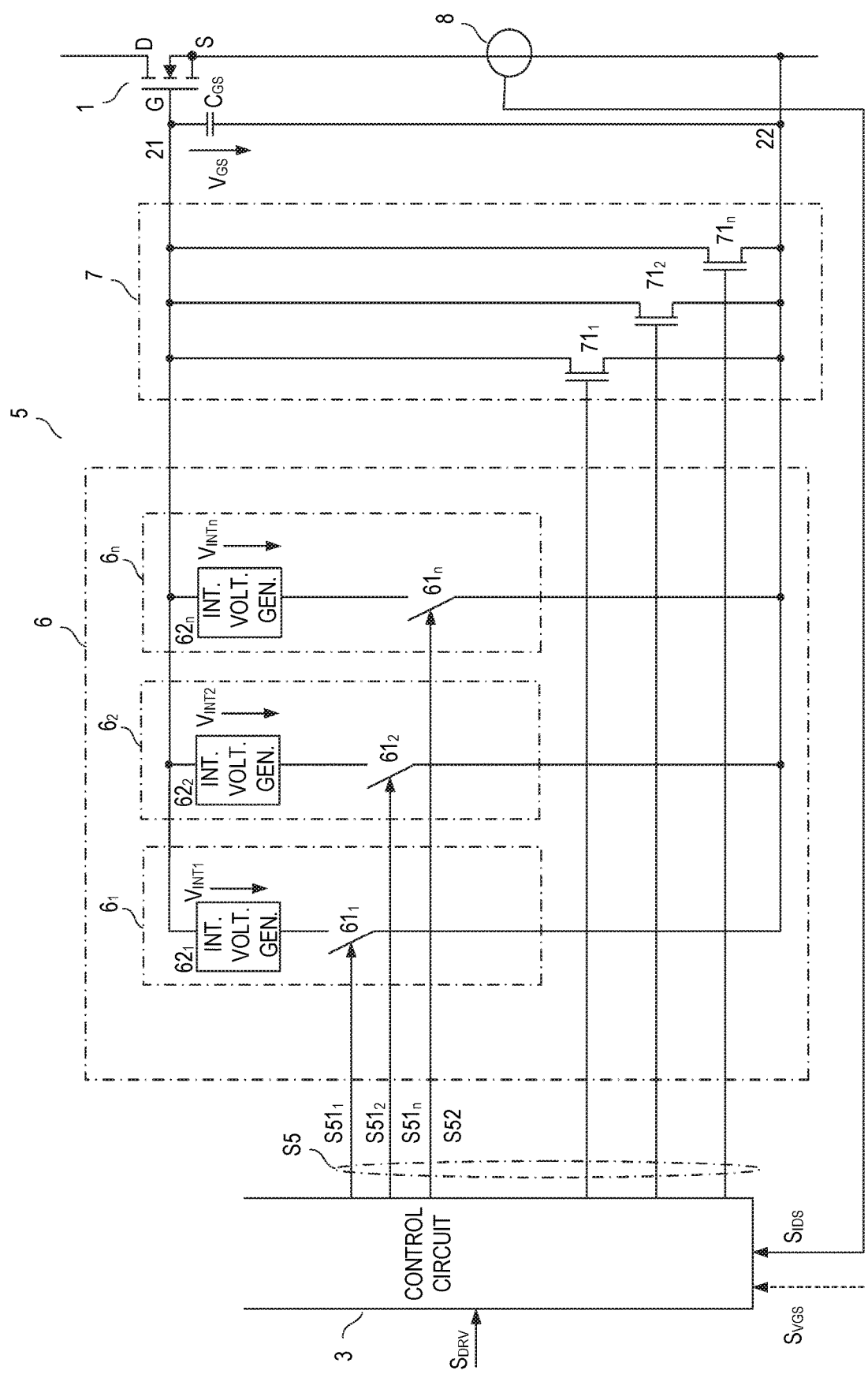
FIG. 31 shows another example of the switch-off circuit shown in FIG. 28.

FIG. 31 shows a switch-off circuit 5 according to another example. In this example, the discharging circuit 7 includes several electronic switches $71_1$-$71_n$ that have different on-resistances and are connected in parallel between the first output node 21 and the second output node 22. In this example, the control circuit, when activating the discharging circuit 7, switches on at least one of these electronic switches $71_1$-$71_n$. According to one example, the control circuit 3 is configured to switch on different groups of switches one after the other in order to shape the discharging current and the drive voltage $V_{GS}$, wherein each of the "different groups of switches" includes one or more of the electronic switches $71_1$-$71_n$.

According to another example, the control circuit 3 is configured to switch on one or more of the electronic switches $71_1$-$71_n$ at the same time and for the complete time period the discharging circuit 7 is activated. An information on which of the switches $71_1$-$71_n$ is/are to be switched on may be stored in a memory, such as a register, of the control circuit 3. The switch(es) that is/are to be switched on may be selected dependent on the type of transistor device 1 connected to the drive circuit.

According to one example, the control circuit 3 receives a drive voltage signal $S_{VGS}$ that represents the drive voltage $V_{GS}$ and is configured to activate the discharging circuit 7 based on the drive voltage signal $S_{VGS}$. According to one example, the control circuit 3 monitors the drive voltage $S_{VGS}$ and activates the first intermediate voltage generator $62_1$ when the drive voltage signal $S_{VGS}$ reaches a first threshold, the second intermediate voltage generator $62_2$ when the drive voltage signal $S_{VGS}$ reaches a second threshold lower than the first threshold, and the third intermediate voltage generator $62_n$ when the drive voltage signal $S_{VGS}$ reaches a third threshold lower than the second threshold in order to obtain a drive voltage profile as illustrated in FIG. 25, for example.

It goes without saying that the methods explained with reference to FIGS. 26 and 21 can be combined in such a way that in the method explained with reference to FIG. 26 there are two or more intermediate voltage phases with different intermediate voltage levels each higher than the threshold voltage level $V_{TH}$. At least one of these different intermediate voltage levels is selected dependent on the load current signal $S_{IDS}$.

Although the present disclosure is not so limited, the following numbered examples demonstrate one or more aspects of the disclosure.

Example 1

A method including: in an on-state of a transistor device, reducing a (gate) drive voltage of the transistor device from a maximum voltage level to an intermediate voltage level that is higher than a threshold voltage level of the transistor device; maintaining (setting) the gate drive voltage at the intermediate voltage level for a predefined time period; and reducing a magnitude of the drive voltage to below the threshold voltage level after the predefined time period to switch the transistor device to an off-state.

Example 2

The method of example 1, wherein a duration of the predefined time period is selected from a range of between 0.1 nanosecond and 10 nanoseconds.

Example 3

The method of any combination of examples 1 to 2, wherein the intermediate voltage level decreases from an upper intermediate voltage level to a lower intermediate voltage level during the predefined time period wherein the upper intermediate voltage level is less than 1.3 times the lower intermediate voltage level.

Example 4

The method of any combination of examples 1 to 3, wherein the transistor device includes an intermediate load path resistance that is associated with the intermediate voltage level, wherein the intermediate voltage is selected such that the intermediate load path resistance is between 0.01 ohm and 1000 ohms.

Example 5

The method of any combination of examples 1 to 4, wherein at least one parasitic inductance is connected in series with the transistor device and a parasitic capacitance is connected in parallel with a load path of the transistor device, wherein the transistor device includes an intermediate load path resistance that is associated with the intermediate voltage level, and wherein the intermediate voltage is selected such that the intermediate load path resistance is given by $$R_{DS\_INT} = c \cdot \sqrt{\frac{Lp_{TOT}}{C_{DS}}},$$

where $Lp_{TOT}$ is an inductance value of the at least one parasitic inductance connected in series with the transistor device, $C_{DS}$ is a capacitance value of the parasitic capacitance, and c is a proportionality factor selected from between 0.01 and 100.

Example 6

The method of any combination of examples 1 to 5, further including: measuring a load current through the transistor device; and selecting the intermediate voltage from a plurality of intermediate voltages dependent on the measured load current.

Example 7

The method of any combination of examples 1 to 6, wherein maintaining the intermediate voltage includes activating an intermediate voltage circuit connected between drive nodes of the transistor device, and wherein the intermediate voltage circuit includes an intermediate voltage generation circuit and an electronic switch connected in series with the intermediate voltage generation circuit.

Example 8

The method of any combination of examples 1 to 7, wherein the intermediate voltage generation circuit includes at least one diode.

Example 9

The method of any combination of examples 1 to 8, wherein decreasing the drive voltage to below the threshold voltage level includes activating a discharging circuit connected between the drive nodes (gate and source) of the transistor device.

Example 10

The method of any combination of examples 1 to 9, further including: before reducing the drive voltage to below the threshold voltage, reducing the drive voltage from the intermediate voltage level to at least one further intermediate voltage level and maintaining the at least one further intermediate voltage for a further predefined time period.

Example 11

The method of any combination of examples 1 to 10, wherein the transistor device is a MOSFET.

Example 12

An electronic circuit, including: a drive circuit, wherein the drive circuit operable to, in an on-state of a transistor device, reduce a drive voltage of the transistor device from a maximum voltage level to an intermediate voltage level that is higher than a threshold voltage level of the transistor device; to maintain the intermediate voltage for a predefined time period; and to reduce the drive voltage to below the threshold voltage after the predefined time period to switch the transistor device to an off-state.

Example 13

The electronic circuit of example 12, wherein the drive circuit includes: output nodes operable to be coupled to drive nodes of the transistor device; an intermediate voltage circuit connected between the output nodes and including an intermediate voltage generation circuit and an electronic switch connected in series with the intermediate voltage generation circuit; a discharging circuit connected between the output nodes.

Example 14

The electronic circuit of any combination of examples 12 to 13, wherein the intermediate voltage generation circuit includes at least one diode.

Example 15

The electronic circuit of any combination of examples 12 to 14, further including the transistor device.

Example 16

The electronic circuit as in any combination of examples 12 to 15, wherein a duration of the predefined time period falls in a range between 0.1 nanosecond and 10 nanoseconds.

Example 17

The electronic circuit as in any combination of examples 12 to 16, wherein the drive circuit is operable to decrease the intermediate voltage level from an upper intermediate voltage level to a lower intermediate voltage level during the predefined time period; and wherein the upper intermediate voltage level is less than 1.3 times the lower intermediate voltage level.

Example 18

The electronic circuit as in any combination of examples 12 to 17, wherein the transistor device has an intermediate load path resistance when driven with the intermediate voltage level; and wherein the intermediate voltage is selected such that the intermediate load path resistance is between 0.01 ohm and 1000 ohms.

Example 19

The electronic circuit as in any combination of examples 12 to 18, wherein the drive circuit is further operable to: measure a load current through the transistor device; and select the intermediate voltage from a plurality of intermediate voltages depending on dependent on the measured load current.

Example 20

The electronic circuit as in any combination of examples 12 to 19, wherein the drive circuit is operable to decrease the gate drive voltage to below the threshold voltage level via activation of a discharging circuit connected between the gate drive node and a source node of the transistor device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

The invention claimed is:

1. A method comprising:
   measuring a load current through a transistor device;
   selecting a magnitude of an intermediate voltage from a plurality of intermediate voltages depending on the measured load current;
   during an on-state of a transistor device, reducing a gate drive voltage of the transistor device from a first voltage level to the intermediate voltage, which is higher than a threshold voltage level of the transistor device;
   setting the gate drive voltage to the intermediate voltage for a predefined time period; and
   reducing a magnitude of the gate drive voltage to below the threshold voltage level after the predefined time period to switch the transistor device to an off-state.

2. The method as in claim 1, wherein a duration of the predefined time period falls in a range between 0.1 nanosecond and 10 nanoseconds.

3. The method as in claim 1, wherein the intermediate voltage includes an upper intermediate voltage level and a lower intermediate voltage level;
   wherein the intermediate voltage is decreased during the predefined time period from the upper intermediate voltage level to the lower intermediate voltage level; and
   wherein a magnitude of the upper intermediate voltage level is less than 1.3 times a magnitude of the lower intermediate voltage level.

4. The method as in claim 1, wherein the transistor device has an intermediate load path resistance ($R_{DS\_INT}$) when driven with the intermediate voltage; and
   wherein the intermediate voltage is selected such that the intermediate load path resistance is between 0.01 ohm and 1000 ohms.

5. The method as in claim 1, wherein the transistor device includes at least one parasitic series inductance and a parallel parasitic capacitance with respect to a load path of the transistor device;

wherein the transistor device has an intermediate load path resistance ($R_{DS\_INT}$) when driven with the intermediate voltage level ($V_{INT}$), and wherein the intermediate voltage ($V_{INT}$) is selected such that the intermediate load path resistance is given by the equation:

$$R_{DS\_INT} = c \cdot \sqrt{\frac{Lp_{TOT}}{C_{DS}}}$$

where $Lp_{TOT}$ is an inductance value of the at least one parasitic series inductance, $C_{DS}$ is a capacitance value of the parallel parasitic capacitance, and c is a proportionality factor selected from between 0.01 and 100.

6. The method as in claim 1 further comprising:
activating an intermediate voltage circuit connected between nodes of the transistor device, the nodes of the transistor device including a gate node and a source node; and
wherein the intermediate voltage circuit comprises an intermediate voltage generation circuit and an electronic switch, the electronic switch connected in series with the intermediate voltage generation circuit.

7. The method of claim 6, wherein the intermediate voltage generation circuit comprises at least one diode.

8. The method of claim 7, wherein reducing the magnitude of the gate drive voltage to below the threshold voltage level comprises activating a discharging circuit connected between the gate node and the source node of the transistor device.

9. The method of claim 1 further comprising:
before reducing the magnitude of the gate drive voltage to below the threshold voltage level, reducing the gate drive voltage from the intermediate voltage to at least one further intermediate voltage level and maintaining the at least one further intermediate voltage level for a further predefined time period.

10. The method of claim 1, wherein the transistor device is a MOSFET (Metal Oxide Semiconductor Field Effect Transistor).

11. The method as in claim 1 further comprising:
selecting a magnitude of the intermediate voltage applied to a gate node of the transistor device based on a drain to source resistance of the transistor device between a drain node and a source node of the transistor.

12. The method as in claim 11 further comprising:
wherein the drain to source resistance of the transistor device between the drain node and the source node is calculated based on an inductance and capacitance associated with the transistor device.

13. The method as in claim 1, wherein the first voltage level is a maximum voltage level.

14. The method as in claim 1, wherein the threshold voltage level is a magnitude at which the transistor device supports controlled conduction between a drain node and source node of the transistor device.

15. The method as in claim 1 further comprising:
selecting a magnitude of the intermediate voltage applied to a gate node of the transistor device based on an amount of current through a path extending between a drain node and a source node of the transistor device.

16. The method as in claim 1 further comprising:
ramping a magnitude of the gate drive voltage at multiple different rates during the predefined time period.

17. The method as in claim 16, wherein the multiple different rates include: i) a first rate of decreasing the magnitude of the gate drive voltage; and ii) a second rate of decreasing the magnitude of the gate drive voltage.

18. The method as in claim 1, wherein setting the gate drive voltage includes: varying a magnitude of the gate drive voltage during the predefined time period.

19. An electronic circuit comprising:
a drive circuit;
wherein the drive circuit is operable to:
during an on-state of a transistor device, reduce a gate drive voltage of the transistor device from a first voltage level to an intermediate voltage, the intermediate voltage being greater than a threshold voltage level of the transistor device;
set the gate drive voltage to the intermediate voltage for a time duration, magnitude of the intermediate voltage varied during the time duration; and
reduce the drive voltage to below the threshold voltage after the time duration to switch the transistor device to an off-state.

20. The electronic circuit as in claim 19, wherein the drive circuit comprises:
output nodes selectively coupled to drive nodes of the transistor device;
an intermediate voltage circuit connected between the output nodes, the intermediate voltage circuit comprising an intermediate voltage generation circuit and an electronic switch connected in series with the intermediate voltage generation circuit;
a discharging circuit connected between the output nodes.

21. The electronic circuit as in claim 20, wherein the intermediate voltage generation circuit comprises at least one diode.

22. The electronic circuit as in claim 19, wherein the electronic circuit includes the transistor device.

23. The electronic circuit as in claim 19, wherein a duration of the time duration falls in a range between 0.1 nanosecond and 10 nanoseconds.

24. The electronic circuit as in claim 19, wherein the intermediate voltage includes a first intermediate voltage level and a second intermediate voltage level;
wherein the drive circuit is operable to decrease a magnitude of the intermediate voltage during the time duration from the upper intermediate voltage level to the lower intermediate voltage level; and
wherein the upper intermediate voltage level is less than 1.3 times the lower intermediate voltage level.

25. The electronic circuit as in claim 19, wherein the transistor device has an intermediate load path resistance when driven with the intermediate voltage; and
wherein the magnitude of the intermediate voltage is selected such that the intermediate load path resistance is between 0.01 ohm and 1000 ohms.

26. The electronic circuit as in claim 19, wherein the drive circuit is further operable to:
measure a load current through the transistor device; and
select the magnitude of the intermediate voltage from a plurality of intermediate voltages depending on the measured load current.

27. The electronic circuit as in claim 19, wherein the drive circuit is operable to decrease the gate drive voltage to below the threshold voltage level via activation of a discharging circuit connected between the gate drive node and a source node of the transistor device.

28. A method comprising:
- during an on-state of a transistor device, reducing a gate drive voltage of the transistor device from a first voltage level to an intermediate voltage, a magnitude of the intermediate voltage being higher than a threshold voltage level to switch the transistor device to an on-state;
- during a transition of controlling the switch device from the on-state to an off-state, setting the gate drive voltage to the intermediate voltage for a duration of time, a magnitude of the intermediate voltage varied during the duration of time; and
- reducing a magnitude of the gate drive voltage to below the threshold voltage level after the duration of time to switch the transistor device to the off-state.

* * * * *

UNITED STATES PATENT AND TRADEMARK OFFICE
CERTIFICATE OF CORRECTION

PATENT NO. : 10,924,102 B2
APPLICATION NO. : 16/460153
DATED : February 16, 2021
INVENTOR(S) : Stefan H. Groiss and Aliaksandr Subotski Page 1 of 1

It is certified that error appears in the above-identified patent and that said Letters Patent is hereby corrected as shown below:

In the Claims

Column 22, Line 18, insert the word --a-- before the word "magnitude"

Signed and Sealed this
Twentieth Day of April, 2021

Drew Hirshfeld
*Performing the Functions and Duties of the
Under Secretary of Commerce for Intellectual Property and
Director of the United States Patent and Trademark Office*